(12) United States Patent
Chung et al.

(10) Patent No.: US 7,345,314 B2
(45) Date of Patent: Mar. 18, 2008

(54) ORGANIC LIGHT EMITTING DIODE DISPLAY AND MANUFACTURING METHOD THEREOF

(75) Inventors: Jae-Hoon Chung, Suwon-si (KR);
Nam-Deog Kim, Yongin-si (KR);
Jung-Soo Rhee, Seoul (KR);
Beohm-Rock Choi, Seoul (KR);
Jong-Sun Lim, Seoul (KR); Chang-Oh Jeong, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 183 days.

(21) Appl. No.: 11/202,340

(22) Filed: Aug. 11, 2005

(65) Prior Publication Data
US 2006/0033099 A1    Feb. 16, 2006

(30) Foreign Application Priority Data
Aug. 12, 2004    (KR)    .................... 10-2004-0063470

(51) Int. Cl.
*H01L 27/15*    (2006.01)
*H01L 29/161*   (2006.01)
*H01L 31/12*    (2006.01)
*H01L 31/153*   (2006.01)
*H01L 33/00*    (2006.01)

(52) U.S. Cl. ............... 257/84; 257/103; 257/E33.013; 257/E33.055

(58) Field of Classification Search ........... 257/84, 257/103, E33.013, E33.055
See application file for complete search history.

(56) References Cited

U.S. PATENT DOCUMENTS

| 6,016,033 | A  | 1/2000  | Jones et al. |
| 6,501,217 | B2 | 12/2002 | Beierlein et al. |
| 6,815,723 | B2* | 11/2004 | Yamazaki et al. ............ 257/88 |
| 2003/0227019 | A1 | 12/2003 | Kim |
| 2003/0234608 | A1 | 12/2003 | Lee et al. |

FOREIGN PATENT DOCUMENTS

| JP | 2003272874   | 9/2003  |
| JP | 2003297575   | 10/2003 |
| JP | 2004014360   | 1/2004  |
| KR | 1020000000629 | 1/2000  |
| KR | 1020010078298 | 2/2001  |
| KR | 1020030001735 | 1/2003  |
| KR | 1020030094656 | 12/2003 |
| KR | 1020040000630 | 1/2004  |
| KR | 10200400212222 | 3/2004 |

OTHER PUBLICATIONS

English Abstract for Publication No. 2003272874.

(Continued)

*Primary Examiner*—Ngân V. Ngô
(74) *Attorney, Agent, or Firm*—F. Chau & Associates, LLC

(57) ABSTRACT

An organic light emitting diode display includes an insulating layer, a stress buffer disposed on the insulating layer, a first electrode disposed on the stress buffer, an organic light emitting member disposed on the first electrode, and a second electrode disposed on the organic light emitting member.

17 Claims, 31 Drawing Sheets

OTHER PUBLICATIONS

English Abstract for Publication No. 2003297575.
English Abstract for Publication No. 2004014360.
English Abstract for Publication No. 20000000629.
English Abstract for Publication No. 1020030001735.
English Abstract for Publication No. 1020010078298.
English Abstract for Publication No. 1020030094656.
English Abstract for Publication No. 1020040000630.
English Abstract for Publication No. 1020040021222.

* cited by examiner

ORGANIC LIGHT EMITTING DIODE DISPLAY AND MANUFACTURING METHOD THEREOF

CROSS-REFERENCE TO RELATED APPLICATIONS

This application claims priority to Korean Patent Application No. 2004-63470, filed on Aug. 12, 2004, the disclosure of which is incorporated herein in its entirety by reference.

BACKGROUND OF THE INVENTION

1. Technical Field

The present disclosure relates to an organic light emitting diode display and manufacturing method thereof, and more particularly to an organic light emitting diode display having a stress buffer.

2. Discussion of Related Art

An organic light emitting diode (OLED) display is a self emissive display device, which displays images by exciting an emissive organic material to emit light. The OLED display includes an anode (i.e., hole injection electrode), a cathode (i.e., electron injection electrode), and an organic light emission layer interposed therebetween. When the holes and the electrons are injected into the light emission layer, they recombine to form excitons, which emit light when they change from an excited state to a ground state.

A plurality of pixels of the OLED display, each of the plurality of pixels including an anode, a cathode, and a light emission layer, are arranged in a matrix and driven in passive matrix (or simple matrix) addressing or active matrix addressing.

A passive matrix type OLED display includes a plurality of anode lines, a plurality of cathode lines intersecting the anode lines, and a plurality of pixels. Each of the plurality of pixels includes a light emission layer. In the passive matrix type OLED display, light emission of a pixel located at the intersection of selected signal lines occurs when one of the anode lines and one of the cathode lines are selected.

The active matrix type OLED display includes a plurality of pixels. Each of the plurality of pixels in the active matrix type OLED includes a switching transistor, a driving transistor, a storage capacitor, an anode, a cathode, and a light emission layer. The active matrix type OLED display further includes a plurality of gate lines transmitting gate signals and a plurality of data lines transmitting data voltages. The switching transistor is connected to one of the gate lines and one of the data lines, and transmits the data voltage from the data line in response to the gate signal. The driving transistor receives the data voltage from the switching transistor and drives a current having a magnitude determined based on the data voltage. The current from the driving transistor enters the light emission layer to cause light emission having an intensity based on the current. The storage capacitor is connected to the data voltage to maintain the data voltage. A gray scaling of the active matrix type OLED display is accomplished by controlling the data voltages to adjust the current driven by the driving transistor. The color representation of the OLED display is obtained by providing red, green and blue light emission layers.

The OLED display includes top emission type and bottom emission type based on a light emitting direction. The top emission type OLED display includes a transparent cathode made of, for example, indium tin oxide (ITO) or indium zinc oxide (IZO) and an opaque anode. The bottom emission type OLED display includes an opaque cathode and a transparent anode. Positions of the anode and the cathode can be altered.

The anode and cathode electrodes of an OLED display can be formed on an insulating layer that includes a flat surface for step coverage. The electrodes contacting the insulating layer can be cracked during a manufacturing process. The crack can also expand into the insulating layer, thereby reducing the productivity of OLED display.

SUMMARY OF THE INVENTION

According to an embodiment of the present invention, an organic light emitting diode display includes an insulating layer, a stress buffer disposed on the insulating layer, a first electrode disposed on the stress buffer, an organic light emitting member disposed on the first electrode, and a second electrode disposed on the organic light emitting member.

The insulating layer may include an organic material that may be hardened by heat.

The stress buffer may have a thermal expansion coefficient between a thermal expansion coefficient of the insulating layer and a thermal expansion coefficient of the first electrode.

The stress buffer may include at least one of ITO, IZO, or Mo and the first electrode may include at least one of Cr, Al, or Ag.

When the first electrode includes Cr, the stress buffer may include at least one of Si, W, or Mo. When the first electrode includes Ag, the stress buffer may include at least one of Si, W, Mo, Cr, Ge, Nb, Ti, Pt, Ni, Au, or Cu. When the first electrode comprises Al, the stress buffer may include at least one of Si, W, Mo, Cr, Ge, Nb, Ti, Pt, Ni, Au, Cu, or Mn.

The first electrode may include a reflective material and the second electrode may include a transparent material.

The organic light emitting diode display may further include a third electrode disposed between the first electrode and the organic light emitting member and having a higher work function than the first electrode. The third electrode may include ITO or IZO.

The stress buffer may have substantially the same planar shape as the first electrode.

The organic light emitting diode display may further include a gate line transmitting a gate signal, a data line transmitting a data signal, a driving voltage line transmitting a driving voltage, a switching transistor coupled to the gate line and the data line, and a driving transistor coupled to the switching transistor, the driving voltage line, and the first electrode.

The organic light emitting diode display may further include a connecting member disposed on the insulating layer and connecting the switching transistor and the driving transistor.

According to an embodiment of the present invention, an organic light emitting diode display includes a thin film transistor, an insulating layer disposed on the thin film transistor, a conductive member disposed on the insulating layer, a first electrode disposed on the conductive member, an organic light emitting member disposed on the first electrode, and a second electrode disposed on the organic light emitting member, wherein the conductive member has a thermal expansion coefficient between a thermal expansion coefficient of the insulating layer and a thermal expansion coefficient of the first electrode.

The insulating layer may include an organic material hardened by heat.

The conductive member may include at least one of ITO, IZO, or Mo and the first electrode may include at least one of Cr, Al, or Ag.

According to an embodiment of the present invention, a method of manufacturing an organic light emitting diode display includes forming an insulating layer, forming a stress buffer on the insulating layer, forming a first electrode on the stress buffer, forming an organic light emitting member on the first electrode, and forming a second electrode on the organic light emitting member.

The method may further include hardening the insulating layer at a temperature of about 200° C. to about 300° C.

BRIEF DESCRIPTION OF THE DRAWINGS

Preferred embodiments of the present disclosure can be understood in more detail from the following descriptions taken in conjunction with the accompanying drawings in which.

DETAILED DESCRIPTION OF PREFERRED EMBODIMENTS

Figure 1:
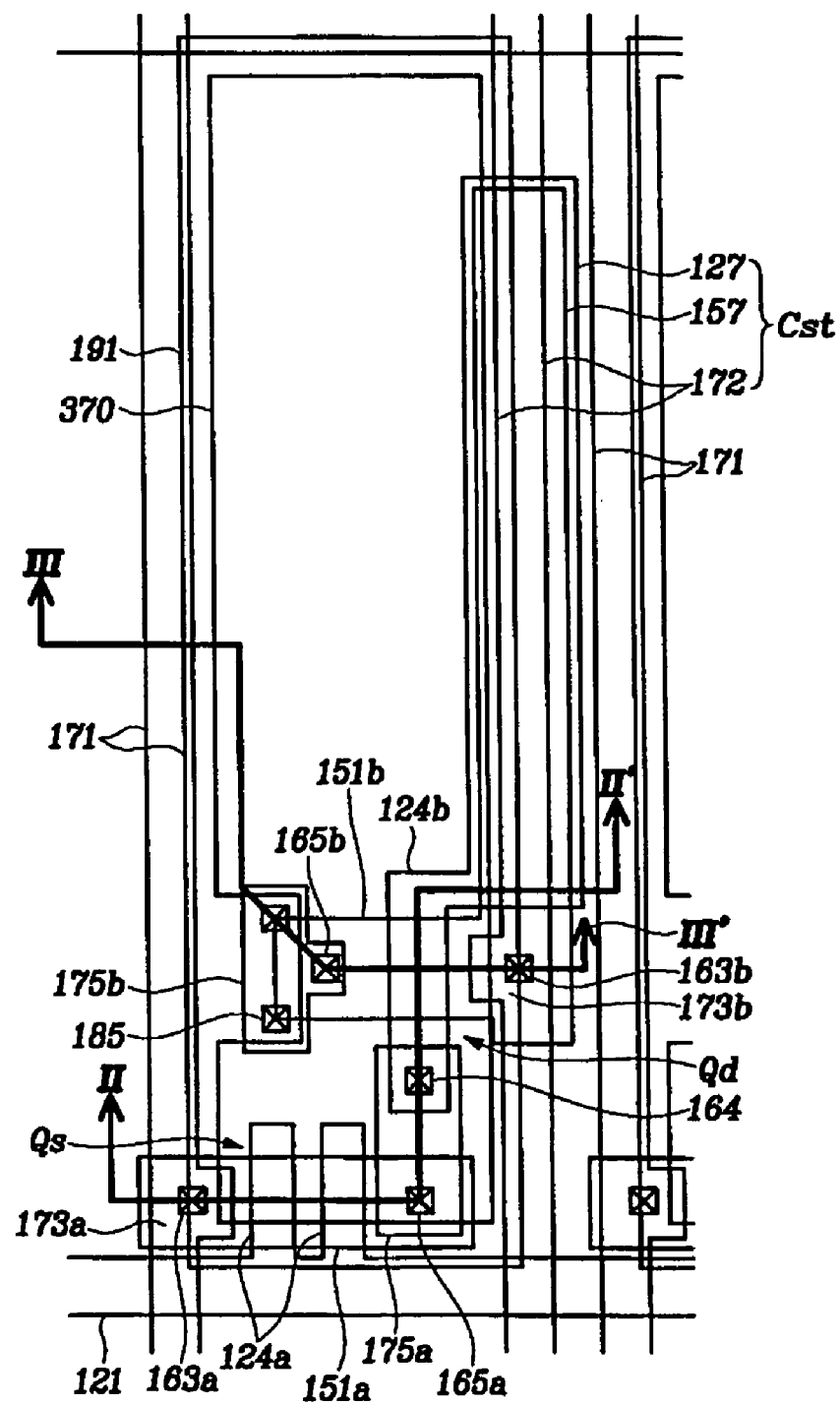
FIG. 1 is a layout view of an OLED display according to an embodiment of the present invention.

Preferred embodiments of the present invention will be described below in more detail with reference to the accompanying drawings. The present invention may, however, be embodied in many different forms and should not be construed as limited to the embodiments set forth herein.

In the drawings, the thickness of layers, films, panels, regions, etc. are exaggerated for clarity. Like numerals refer to like elements throughout. It will be understood that when an element such as a layer, film, region or substrate is referred to as being "on" another element, it can be directly on the other element or intervening elements may also be present.

Figure 2:
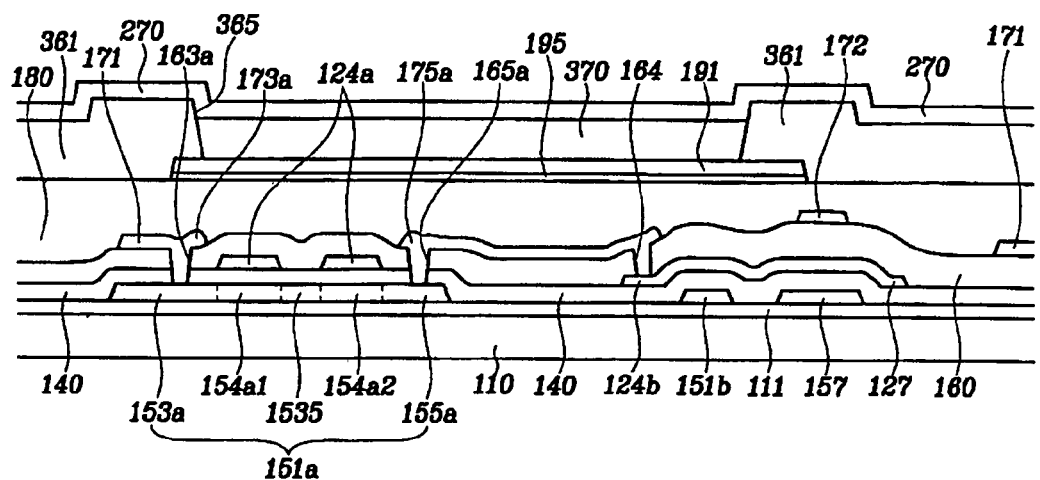
FIGS. 2 and 3 are sectional views of the OLED display shown in FIG. 1 taken along the lines II-II' and III-III', respectively.
Figure 3:
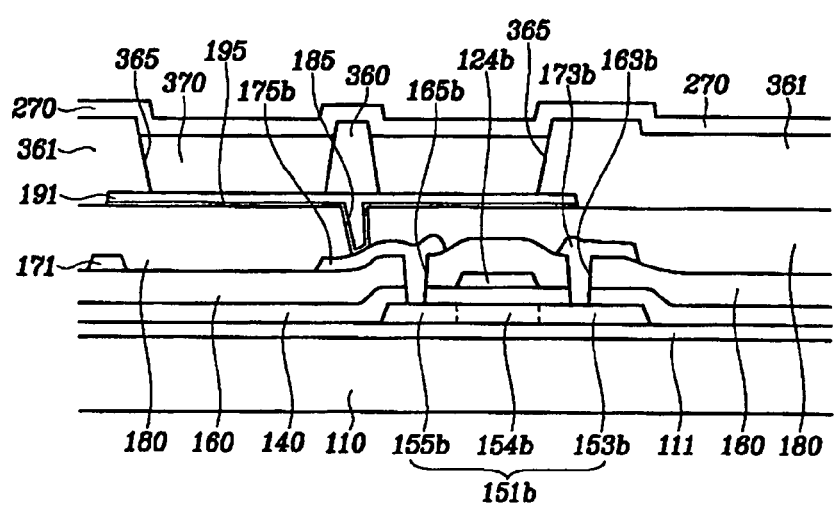

An OLED display according to an embodiment of the present invention is described with reference to FIGS. 1-3. FIG. 1 is a layout view of an OLED display according to an embodiment of the present invention. FIGS. 2 and 3 are sectional views of the OLED display shown in FIG. 1 taken along the lines II-II' and III-III', respectively.

A blocking film 111 comprising, for example, silicon nitride (SiNx) or silicon oxide (SiOx) is formed on an insulating substrate 110. The insulating substrate 110 comprises, for example, transparent glass or plastic. The blocking film 111 may comprise a dual-layered structure.

A plurality of pairs of first and second semiconductor islands 151a and 151b comprising, for example, polysilicon are formed on the blocking film 111. Each of the semiconductor islands 151a and 151b includes a plurality of extrinsic regions containing N type or P type conductive impurity and at least one intrinsic region hardly containing conductive impurity.

The first semiconductor island 151a includes extrinsic regions including first source/drain regions 153a and 155a and an intermediate region 1535. The first source/drain regions 153a and 155a and the intermediate region 1535 are doped with N type conductive impurity and separated from one another. Intrinsic regions of the first semiconductor island 151a include a pair of first channel regions 154a1 and 154a2 disposed between the extrinsic regions 153a, 1535 and 155a.

Regarding a second semiconductor island 151b, extrinsic regions include second source/drain regions 153b and 155b, which are doped with P type conductive impurity and separated from one another. Intrinsic regions include a second channel region 154b disposed between the second source/drain regions 153b and 155b and a storage region 157. The storage region 157 extends upward from the second source/drain region 153b.

The extrinsic regions may further include lightly doped regions (not shown) disposed between the channel regions 154a1, 154a2 and 154b and the source/drain regions 153a, 155a, 153b and 155b. The lightly doped regions may be substituted with offset regions that contain substantially no impurity.

Alternatively, the extrinsic regions 153a and 155a of the first semiconductor islands 151a can be doped with P type conductive impurity, while the extrinsic regions 153b and 155b of the second semiconductor islands 151b are doped with N type conductive impurity. Examples of P type conductive impurity are boron (B) and gallium (Ga) and those of N type conductive impurity are phosphorous (P) and arsenic (As).

A gate insulating layer 140 comprising, for example, silicon nitride or silicon oxide is formed on the semiconductor islands 151a and 151b and the blocking film 111. A plurality of gate conductors include a plurality of gate lines 121 comprising first control electrodes 124a and a plurality of second control electrodes 124b. The plurality of gate conductors are formed on the gate insulating layer 140.

The gate lines 121 for transmitting gate signals extend substantially in a transverse direction. The first control electrodes 124a project upward from the gate line 121 and intersect the first semiconductor islands 151a for overlapping the first channel regions 154a1 and 154a2. Each gate line 121 may include an end portion having a large area for contacting another layer or an external driving circuit. The gate lines 121 may extend to be connected to a gate driving circuit (not shown) for generating the gate signals, which may be integrated on the substrate 110.

The second control electrodes 124b are separated from the gate lines 121 and overlap the second channel regions 154b. The second control electrodes 124b extend to form storage electrodes 127 overlapping the storage regions 157 of the second semiconductor islands 151b.

The gate conductors 121 and 124b can be made of, for example, Al containing metal such as Al and Al alloy (e.g. Al—Nd), Ag containing metal such as Ag and Ag alloy, Cu containing metal such as Cu and Cu alloy, Mo containing metal such as Mo and Mo alloy, Cr, Ta, Ti, etc. The gate conductors 121 and 124b may have a multi-layered structure including two films having different physical characteristics. One of the two films can comprise a low resistivity metal including Al containing metal, Ag containing metal, and Cu containing metal for reducing signal delay or voltage drop. The other film can comprise a material such as Mo containing metal, Cr, Ta, or Ti, which has good physical, chemical, and electrical contact characteristics with other materials such as indium tin oxide (ITO) or indium zinc oxide (IZO). Examples of a combination of the two films are a lower Cr film and an upper Al (alloy) film and a lower Al (alloy) film and an upper Mo (alloy) film. Alternatively, the gate conductors 121 and 124b may comprise other various metals or conductors.

The lateral sides of the gate conductors 121 and 124b are inclined to a surface of the substrate 110, and the inclination angle thereof ranges about 30° to about 80°.

An interlayer insulating film 160 is formed on the gate conductors 121 and 124b. The interlayer insulating film 160 can comprise, for example, an inorganic insulator such as silicon nitride and silicon oxide, an organic insulator, or a low dielectric insulator. The organic insulator or the low dielectric insulator preferably has a dielectric constant less than about 4.0 and includes a-Si:C:O and a-Si:O:F formed by plasma enhanced chemical vapor deposition (PECVD). The organic insulator for the interlayer insulation 160 may have photosensitivity. The interlayer insulation 160 may have a flat surface.

The interlayer insulating film 160 has a plurality of contact holes 164 exposing the second control electrodes 124b. The interlayer insulating film 160 and the gate insulating layer 140 have a plurality of contact holes 163a, 163b, 165a and 165b exposing the source/drain regions 153a, 153b, 155a and 155b.

A plurality of data conductors including a plurality of data lines 171, a plurality of driving voltage lines 172, and a plurality of first and second output electrodes 175a and 175b are formed on the interlayer insulating film 160.

The data lines 171 for transmitting data signals extend substantially in a longitudinal direction and intersect the gate lines 121. Each data line 171 includes a plurality of first input electrodes 173a connected to the first source/drain regions 153a through the contact holes 163a. Each data line 171 may include an end portion having a large area for contacting another layer or an external driving circuit. The data lines 171 may extend to be directly connected to a data driving circuit (not shown) for generating data signals, which may be integrated on the substrate 110.

The driving voltage lines 172 for transmitting driving voltages extend substantially in the longitudinal direction and intersect the gate lines 121. Each driving voltage line 172 includes a plurality of second input electrodes 173b connected to the second source/drain regions 153b through the contact holes 163b. The driving voltage lines 171 overlap the storage electrodes 127 and they may be connected to each other.

The first output electrodes 175a are separated from the data lines 171 and the driving voltage lines 172. The first output electrodes 175a are connected to the first source/drain regions 155a through the contact holes 165a and to the second control electrodes 124b through the contact hole 164.

The second output electrodes 175b are separated from the data lines 171, the driving voltage lines 172, and the first output electrodes 175a. The second output electrodes 175b are connected to the second source/drain regions 155b through the contact holes 165b.

The data conductors 171, 172, 175a and 175b comprise, for example, a refractory metal including Mo, Cr, Ti, Ta or alloys thereof. They may have a multi-layered structure preferably including a refractory metal film and a low resistivity film. Examples of the multi-layered structure are a double-layered structure including a lower Cr film and an upper Al (alloy) film, a double-layered structure of a lower Mo (alloy) film and an upper Al (alloy) film, and a triple-layered structure of a lower Mo (alloy) film, an intermediate Al (alloy) film, and an upper Mo (alloy) film.

Like the gate conductors 121 and 124b, the data conductors 171, 172, 175a and 175b have inclined edge profiles. The inclination angles thereof range about 30° to about 80°.

A passivation layer 180 is formed on the data conductors 171, 172, 175a and 175b. The passivation layer 180 preferably has a thickness of about 1.0 µm to about 10.0 µm. The passivation layer 180 comprises, for example, an organic insulator such as polyimide or poly-acryl capable of providing a flat surface. Alternatively, the passivation layer 180 may comprise an inorganic insulator, other organic insulators, or a low dielectric insulator.

The passivation layer 180 includes a plurality of contact holes 185 exposing the second output electrodes 175b. The passivation layer 180 may further include a plurality of contact holes (not shown) exposing end portions of the data lines 171. The passivation layer 180 and the interlayer insulating film 160 may include a plurality of contact holes (not shown) exposing end portions of the gate lines 121.

A plurality of stress buffers 195 and a plurality of pixel electrodes 191 are sequentially formed on the passivation layer 180. The pixel electrodes 191 and the stress buffers 195 are connected to the second output electrodes 175b through the contact holes 185.

The pixel electrodes 191 comprises, for example, a reflective conductor such as Cr, Al, Ag, or alloys thereof having reflectance higher than about 70% for visible light. A thickness of the pixel electrodes 191 may range from about 10 nm to about 100 nm.

The stress buffers 195 have substantially the same planar shape as the pixel electrodes 191 and have a thickness in a range from about 50 nm to about 500 nm. The stress buffers 195 comprise, for example, a material having a thermal expansion coefficient ranging between that of the passivation layer 180 and that of the pixel electrodes 191 for preventing the pixel electrodes 191 from being exfoliated or cracked from the passivation layer 180.

The stress buffers 195 comprise, for example, ITO, IZO or Mo containing metal. Alternatively, the stress buffers 195 comprise at least one selected from Si, W, or Mo when Cr is used for the pixel electrodes 191. The stress buffers 195 may comprise at least one selected from Si, W, Mo, Cr, Ge, Nb, Ti, Pt, Ni, Au, or Cu when Ag is used for the pixel electrodes 191. The stress buffers 195 may comprise at least one selected from Si, W, Mo, Cr, Ge, Nb, Ti, Pt, Ni, Au, Cu or Mn when Al is used for the pixel electrodes 191.

A plurality of auxiliary electrodes (not shown) comprise, for example, a material such as ITO or IZO having a higher work function than the pixel electrodes 191. The work function may be more than about 5 eV. The plurality of auxiliary electrodes may be formed on the pixel electrodes 191 for enhancing injection of the electrons.

A plurality of contact assistants (not shown) or connecting members (not shown) may be also formed on the passivation layer 180 such that they are connected to exposed end portions of the gate lines 121 or the data lines 171.

A partition 361 is formed on the passivation layer 180. The partition 361 surrounds the pixel electrodes 191 to define openings 365. The partition may comprise organic or inorganic insulating materials. The partition 361 may be made of a photosensitive material containing black pigment. A black partition 361 may function as a light blocking member and the formation of the partition 361 may be simplified.

A plurality of light emitting members 370 are formed on the pixel electrodes 191 and formed in the openings 365 defined by the partition 361. Each of the light emitting members 370 comprises, for example, an organic material emitting one of primary color lights, i.e., red, green and blue lights. The OLED display displays images by spatially adding monochromatic primary color lights emitted from the light emitting members 370.

Each of the light emitting members 370 may have a multilayered structure including an emitting layer (not shown) for emitting light and auxiliary layers (not shown) for improving the efficiency of light emission of the emitting layer. The auxiliary layers may include an electron transport layer (not shown) and a hole transport layer (not shown) for improving the balance of the electrons and holes. The auxiliary layers may further include an electron injecting layer (not shown) and a hole injecting layer (not shown) for improving the injection of the electrons and holes.

A common electrode 270 is formed on the light emitting members 370 and the partition 361. The common electrode 270 is supplied with the common voltage and may comprise a transparent material such as ITO and IZO.

In the above-described OLED display, a first semiconductor island 151a, a first control electrode 124a connected to a gate line 121, a first input electrode 153a connected to a data line 171, and a first output electrode 155a form a switching TFT Qs. The switching TFT Qs includes a channel formed in the channel regions 154a1 and 154a2 of the first semiconductor 151a. A second semiconductor island 151b, a second control electrode 124b connected to a first output electrode 155a, a second input electrode 153b connected to a driving voltage line 172, and a second output electrode 155b connected to a pixel electrode 191 form a driving TFT Qd. The driving TFT Qd includes a channel formed in the channel region 154b of the second semiconductor 151b. A pixel electrode 191, a light emitting member 370, and the common electrode 270 form an organic light emitting diode having the pixel electrode 191 as an anode and the common electrode 270 as a cathode or vice versa. The overlapping portions of a storage electrode 127, a driving voltage line 172, and a storage region 157 form a storage capacitor Cst.

The switching TFT Qs transmits data signals to the data line 171 in response to a gate signal from the gate line 121. The driving TFT Qd drives a current having a magnitude based on the voltage difference between the second control electrode 124b and the second output electrode 175b upon receipt of the data signals. The voltage difference between the second control electrode 124b and the second input electrode 173b is stored in the storage capacitor Cst and maintained after the switching TFT Qs is turned off. The light emitting diode emits light having intensity based on the current driven by the driving TFT Qd. The monochromatic primary color lights emitted from the light emitting diodes are spatially added to display images.

The OLED display according to an embodiment, which includes opaque pixel electrodes 191 and a transparent common electrode 270, emits light toward the top of the substrate 110. This type of OLED display is referred to as a top emission OLED display. Alternatively, an embodiment of the present invention may be employed to a bottom emission OLED display. The bottom emission OLED display includes transparent pixel electrodes 191 and an opaque common electrode 270 and emits light toward the bottom of the substrate 110.

The semiconductor islands 151a and 151b may comprise amorphous silicon without an intrinsic region. In this embodiment, ohmic contacts (not shown) may comprise amorphous silicon heavily doped with N type conductive impurity may be interposed between the semiconductor islands 151a and 151b and the data conductors 171, 172, 175a and 175b.

The gate electrodes 124a and 124b may be disposed under the semiconductor islands 151a and 151b, while the gate insulating layer 140 is interposed between the semiconductor islands 151a and 151b and the gate electrodes 124a and 124b. The data conductors 171, 172, 173b and 175b may be disposed directly on the gate insulating layer 140.

In addition, the data conductors 171, 172, 173b and 175b may be disposed under the semiconductor islands 151a and 151b and may electrically contact the semiconductor islands 151a and 151b.

A method of manufacturing the OLED display shown in FIGS. 1-3 according to an embodiment of the present invention is described with reference to FIGS. 4-19B as well as FIGS. 1-3.

FIGS. 4, 6, 8, 10, 12, 14, 16 and 18 are layout views of intermediate steps of a manufacturing an OLED display shown in FIGS. 1-3 according to an embodiment of the present invention. FIGS. 5A and 5B are sectional views of the OLED display shown in FIG. 4 taken along the lines VA-VA' and VB-VB', respectively. FIGS. 7A and 7B are sectional views of the OLED display shown in FIG. 6 taken along the lines VIIA-VIIA' and VIIB-VIIB', respectively. FIGS. 9A and 9B are sectional views of the OLED display shown in FIG. 8 taken along the lines IXA-IXA' and IXB-IXB', respectively. FIGS. 11A and 11B are sectional views of the OLED display shown in FIG. 10 taken along the lines XIA-XIA' and XIB-XIB', respectively. FIGS. 13A and 13B are sectional views of the OLED display shown in FIG. 12 taken along the lines XIIIA-XIIIA' and XIIIB-XIIIB', respectively. FIGS. 15A and 15B are sectional views of the OLED display shown in FIG. 14 taken along the lines XVA-XVA' and XVB-XVB', respectively. FIGS. 17A and 17B are sectional views of the OLED display shown in FIG. 16 taken along the lines XVIIA-XVIIA' and XVIIB-XVIIB', respectively. FIGS. 19A and 19B are sectional views of the OLED display shown in FIG. 18 taken along the lines XIXA-XIXA' and XIXB-XIXB'.

A blocking layer 111 is formed on an insulating substrate 110. A semiconductor layer comprising amorphous silicon is deposited on the blocking layer 111 preferably by LTCVD (low temperature chemical vapor deposition), PECVD (plasma enhanced chemical vapor deposition) or sputtering.

Figure 4:
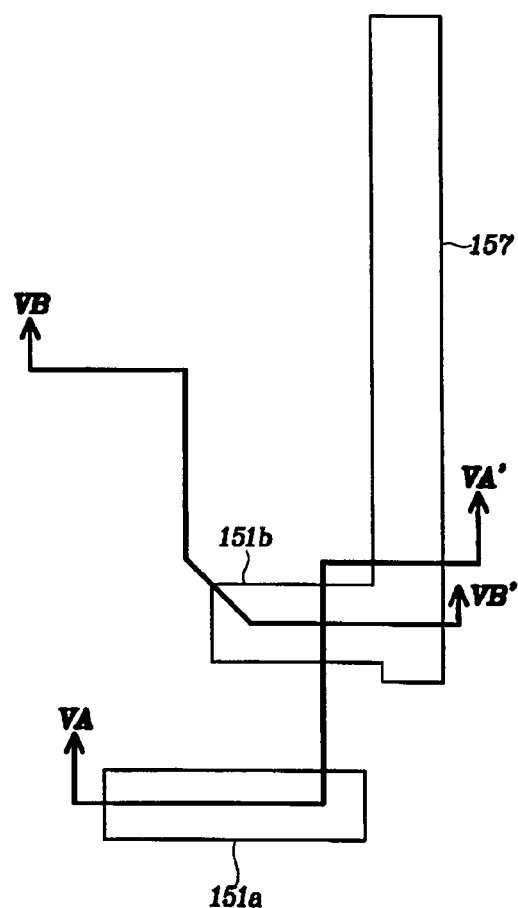
FIGS. 4, 6, 8, 10, 12, 14, 16 and 18 are layout views of intermediate steps of manufacturing an OLED display shown in FIGS. 1-3 according to an embodiment of the present invention.
Figure 5A:
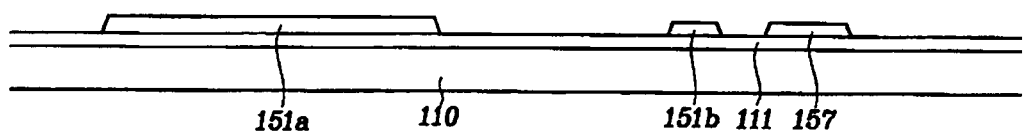
FIGS. 5A and 5B are sectional views of the OLED display shown in FIG. 4 taken along the lines VA-VA' and VB-VB', respectively.
Figure 5B:
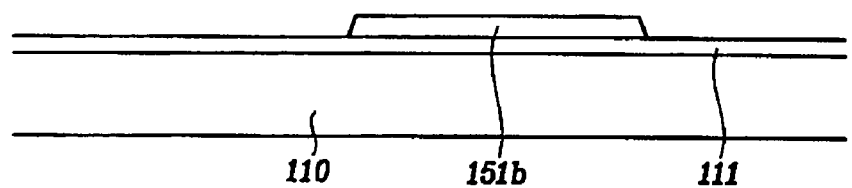

The semiconductor layer is crystallized into polysilicon and photo-etched to form a plurality of pairs of first and second semiconductor islands 151a and 151b as shown in FIGS. 4-5B.

Figure 6:
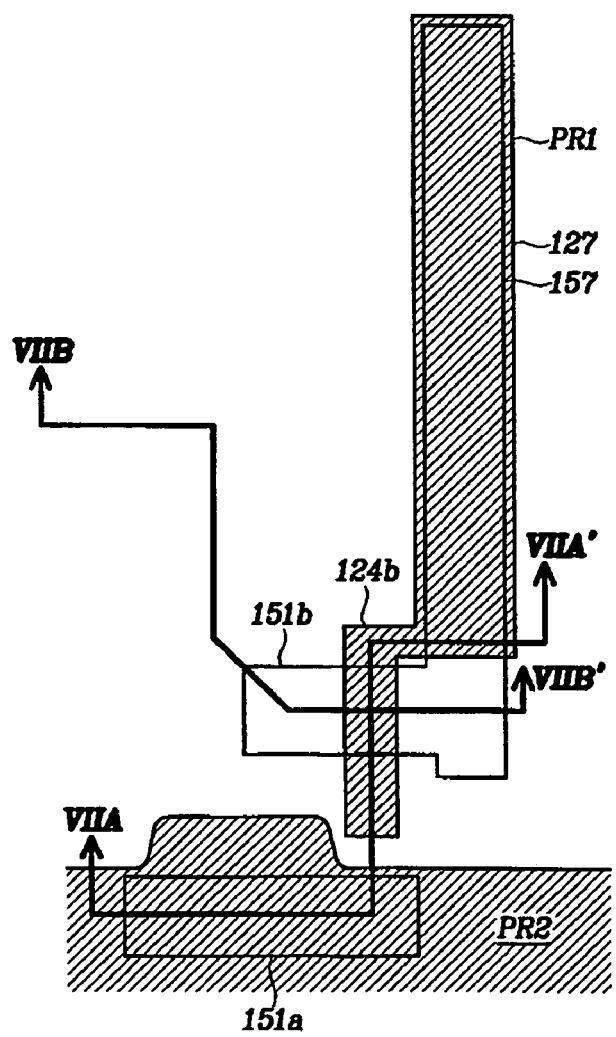
Figure 7A:
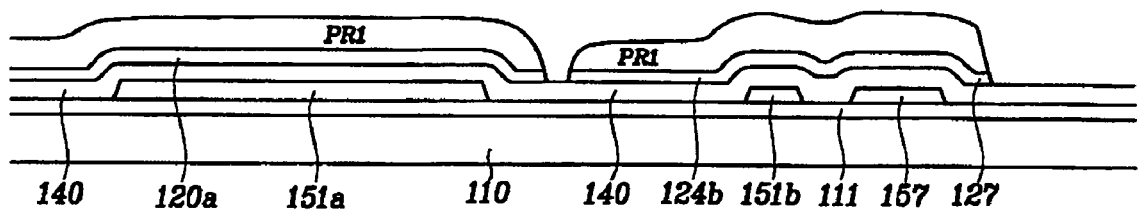
FIGS. 7A and 7B are sectional views of the OLED display shown in FIG. 6 taken along the lines VIIA-VIIA' and VIIB-VIIB', respectively.
Figure 7B:
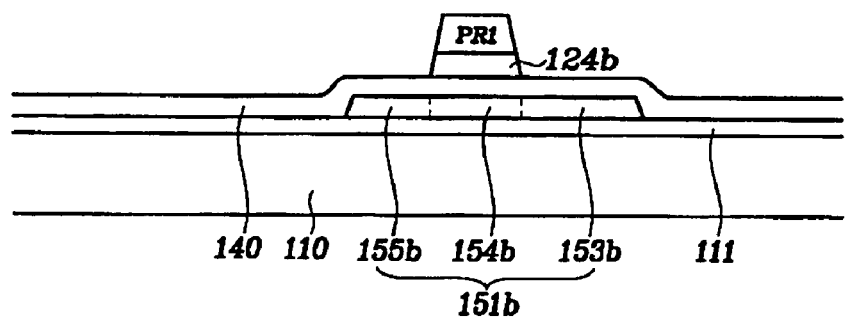

Referring to FIGS. 6-7B, a gate metal layer is deposited on the gate insulating layer 140. A first photoresist PR1 is formed on the gate metal layer. The gate metal layer is etched using the first photoresist PR1 as an etch mask to form a plurality of gate electrodes 124b including storage electrodes 127 and a plurality of gate metal members 120a. P type conductive impurity is introduced into portions of the second semiconductor islands 151b. The second semiconductor islands 151b are covered with the gate electrodes 124b and the first photoresist PR1 to form a plurality of P type conductive extrinsic regions 153b and 155b. The first semiconductor islands 151a are covered with the first photoresist PR1 and the gate metal members 120a to be protected from impurity implantation.

Figure 8:
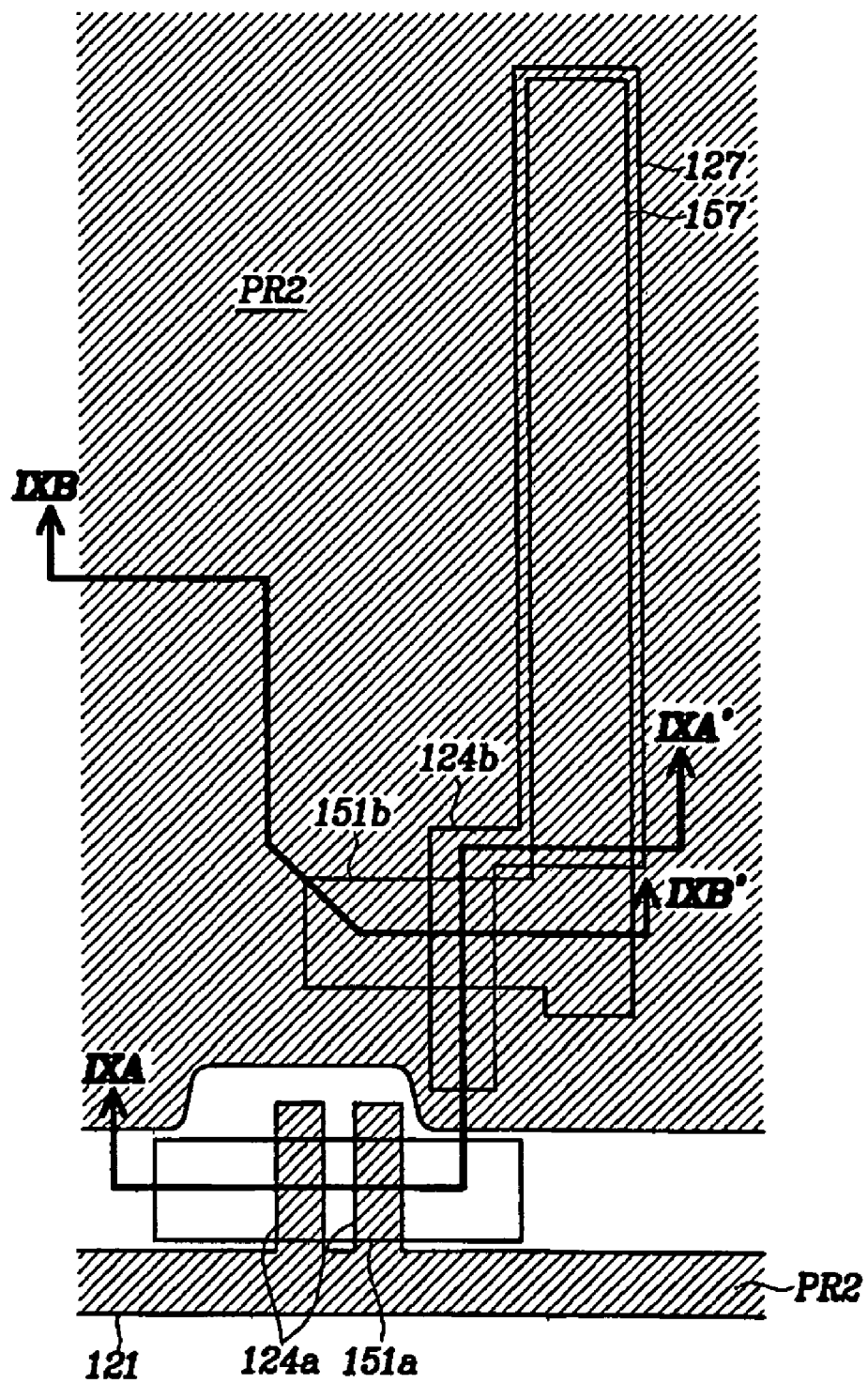
Figure 9A:
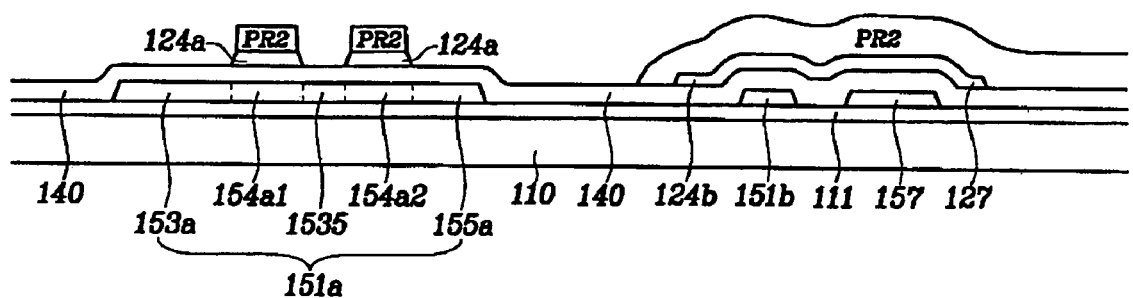
FIGS. 9A and 9B are sectional views of the OLED display shown in FIG. 8 taken along the lines IXA-IXA' and IXB-IXB', respectively.
Figure 9B:
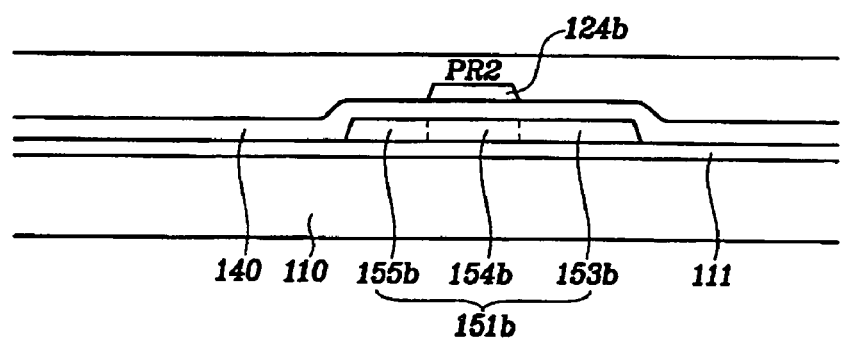

Referring to FIGS. 8-9B, the first photoresist PR1 is removed and a second photoresist PR2 is formed. The gate metal members 120a are etched using the second photoresist PR2 as an etch mask to form a plurality of gate lines 121 including gate electrodes 124a. N type conductive impurity is injected into portions of the first semiconductor islands 151a. The first semiconductor islands 151a are not covered with the gate lines 121 and the gate electrodes 124b as well as the second photoresist PR2, to form a plurality of N type extrinsic regions 153a and 155a. At this time, the second semiconductor islands 151b are covered with the second photoresist PR2 to be protected from impurity implantation.

Figure 10:
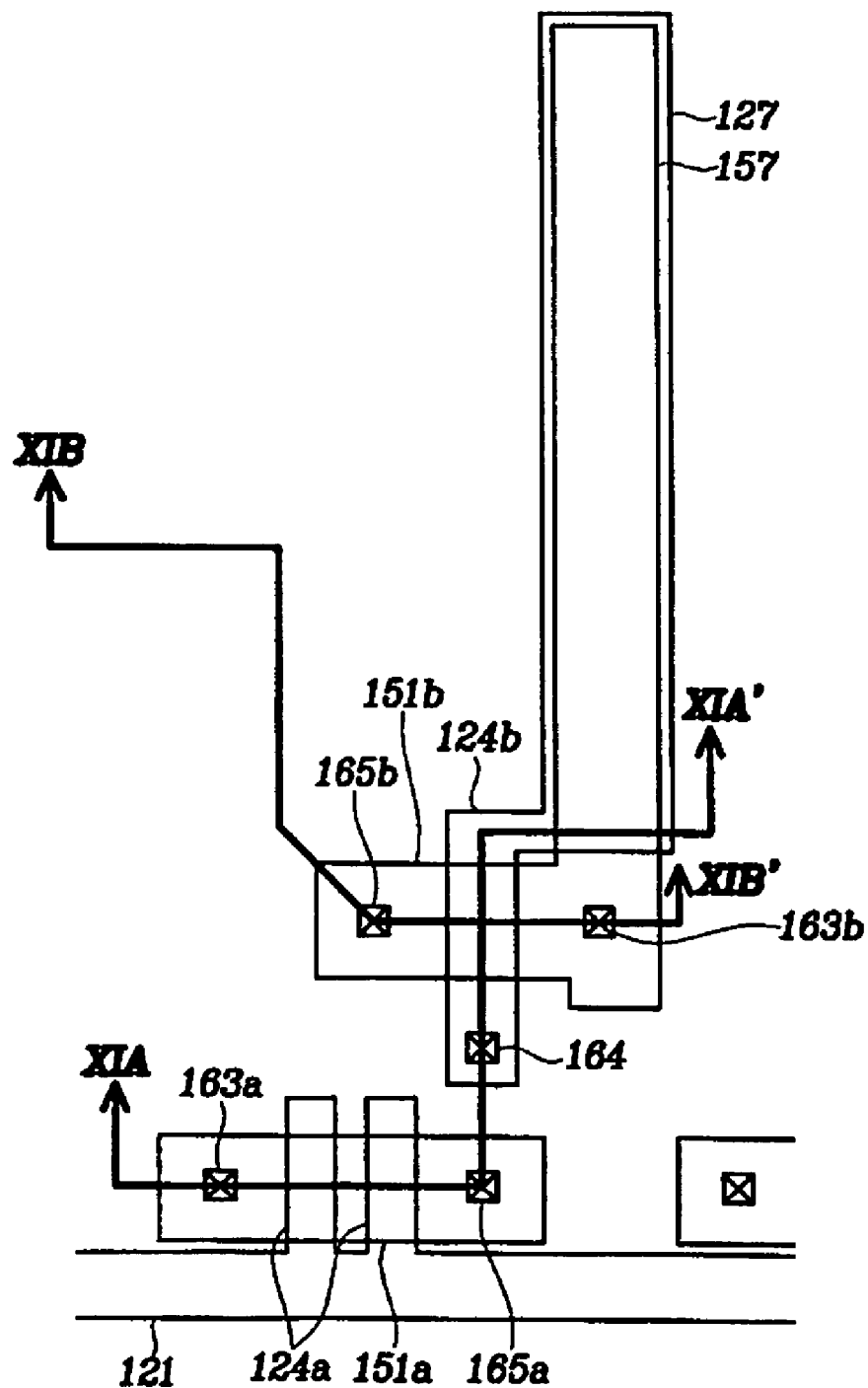
Figure 11A:
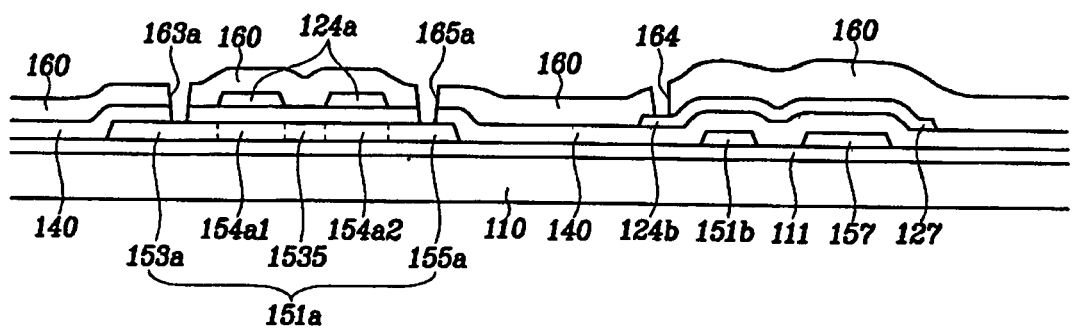
FIGS. 11A and 11B are sectional views of the OLED display shown in FIG. 10 taken along the lines XIA-XIA' and XIB-XIB', respectively.
Figure 11B:
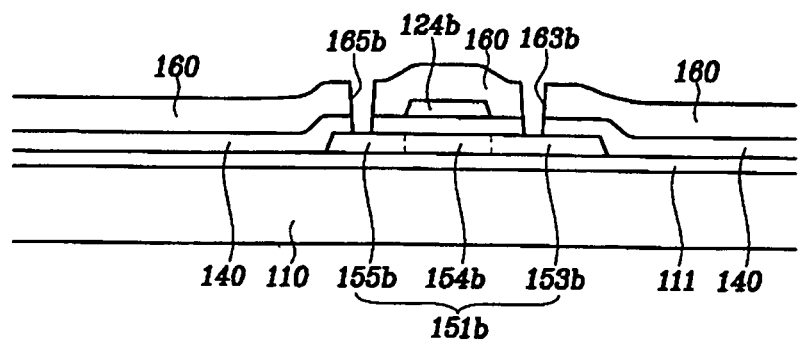

Referring to FIGS. 10-11B, an interlayer insulating film 160 is deposited. The interlayer insulating film 160 and the gate insulating layer 140 are photo-etched to form a plurality of contact holes 163a, 163b, 165a and 165b exposing the extrinsic regions 153a, 155a, 153b and 155b, respectively, and to form a plurality of contact holes 164 exposing the gate electrodes 124b.

Figure 12:
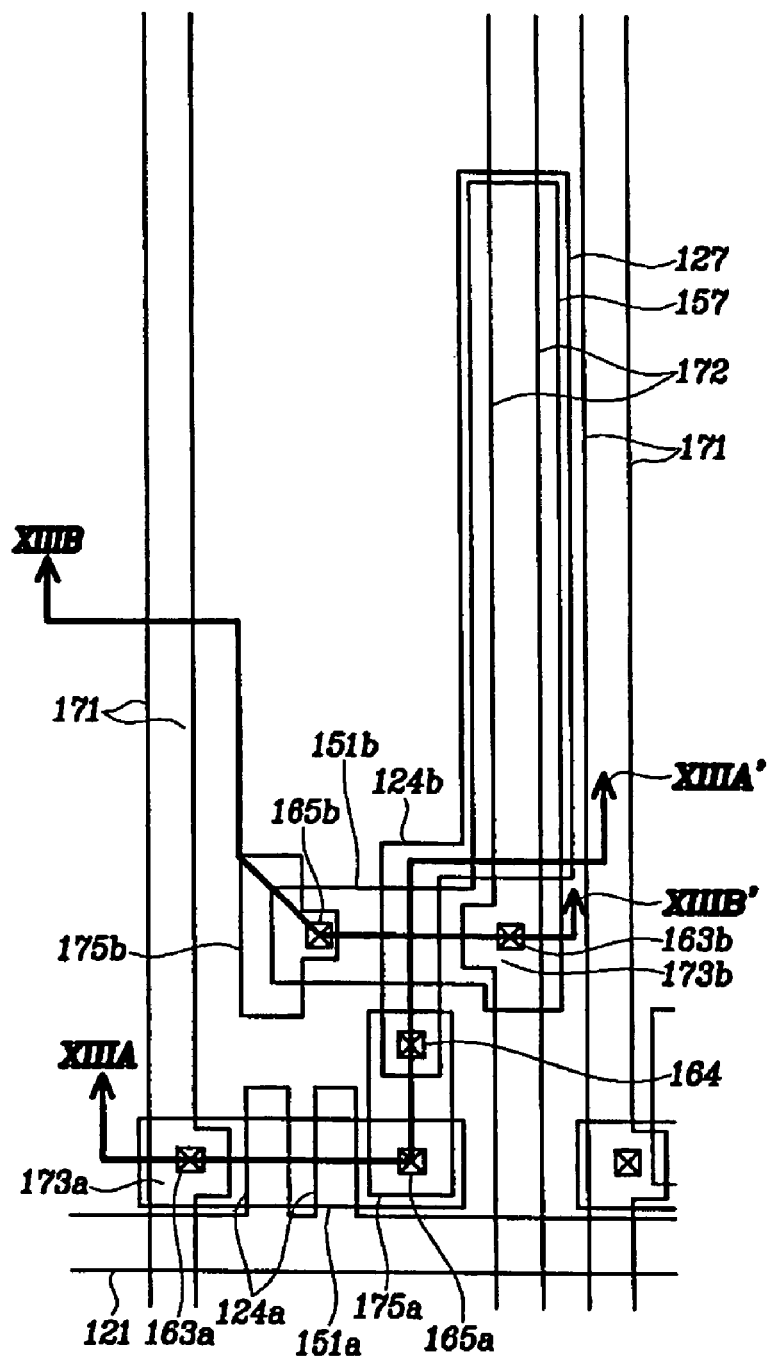
Figure 13A:
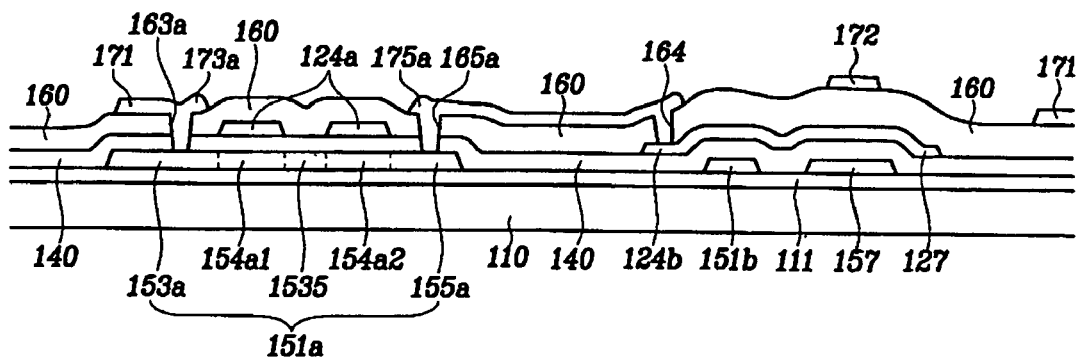
FIGS. 13A and 13B are sectional views of the OLED display shown in FIG. 12 taken along the lines XIIIA-XIIIA' and XIIIB-XIIIB', respectively.
Figure 13B:
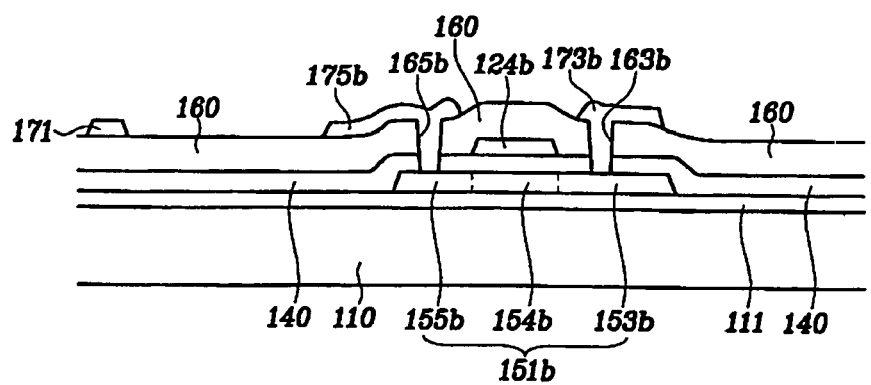

Referring to FIGS. 12-13B, a plurality of data conductors including a plurality of data lines 171 including first input (e.g., source) electrodes 173a, a plurality of driving voltage lines 172 including second input (e.g., source) electrodes 173b, and a plurality of first and second output (e.g., drain) electrodes 175a and 175b are formed on the interlayer insulating layer 160.

Figure 14:
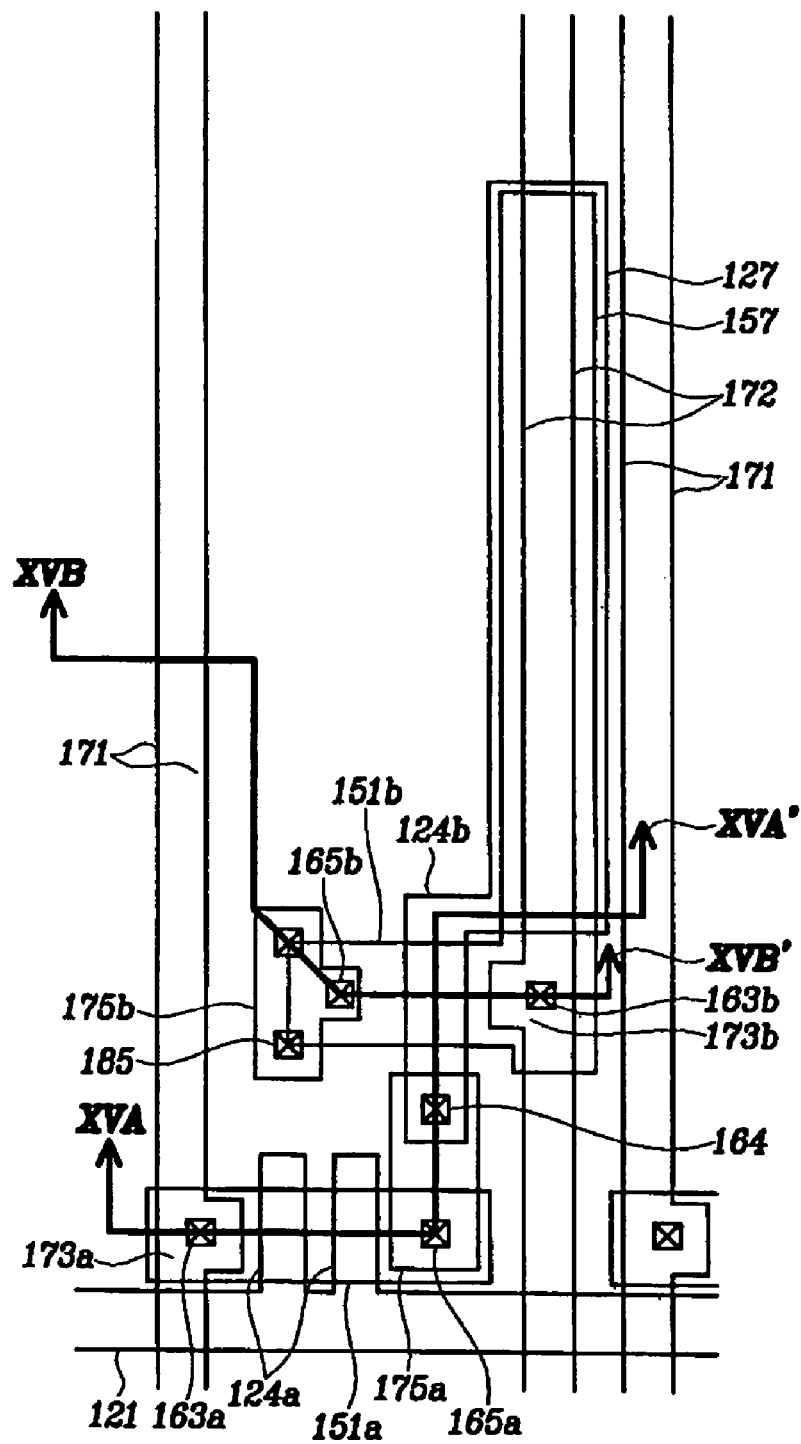
Figure 15A:
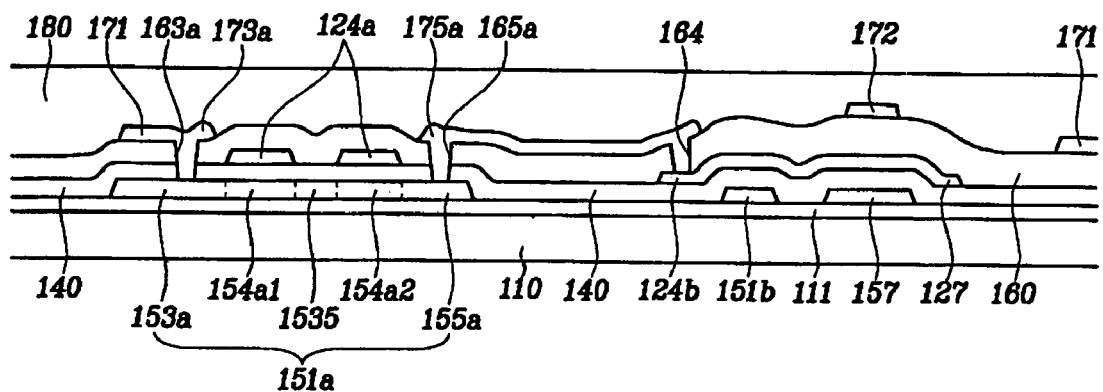
FIGS. 15A and 15B are sectional views of the OLED display shown in FIG. 14 taken along the lines XVA-XVA' and XVB-XVB', respectively.
Figure 15B:
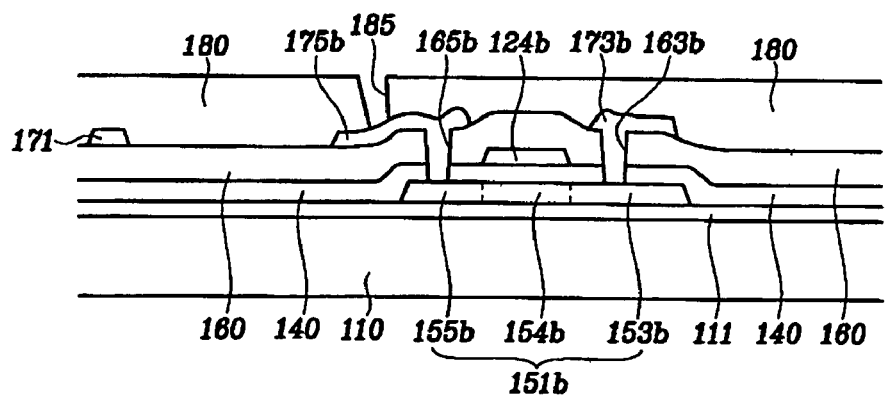

Referring to FIGS. 14-15B, a passivation layer 180 comprising, for example, an organic material such as polyimide or acryl is deposited by spin coating, roll coating, cap coating, etc. The passivation layer 180 is patterned by lithography to form a plurality of contact holes 185 exposing the second output electrodes 175b.

Figure 16:
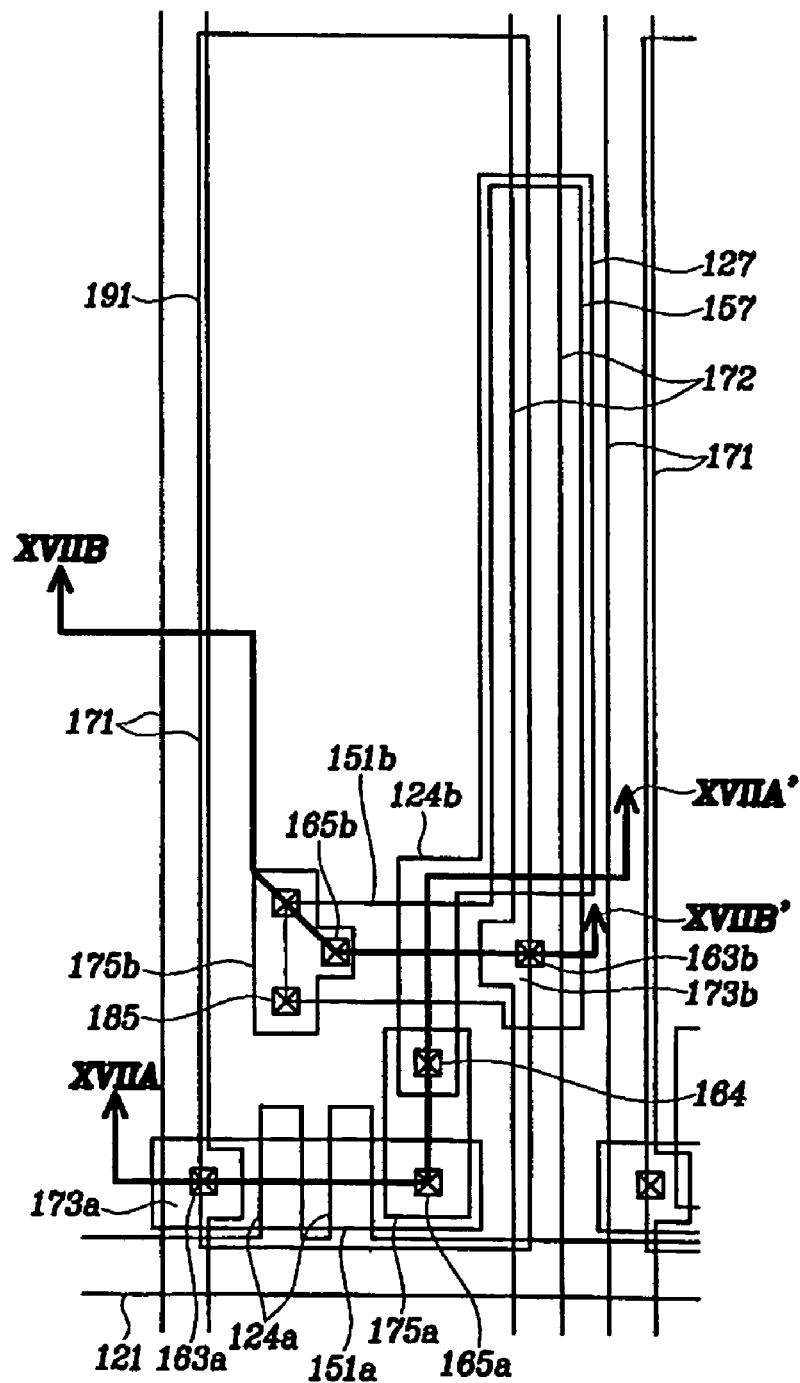
Figure 17A:
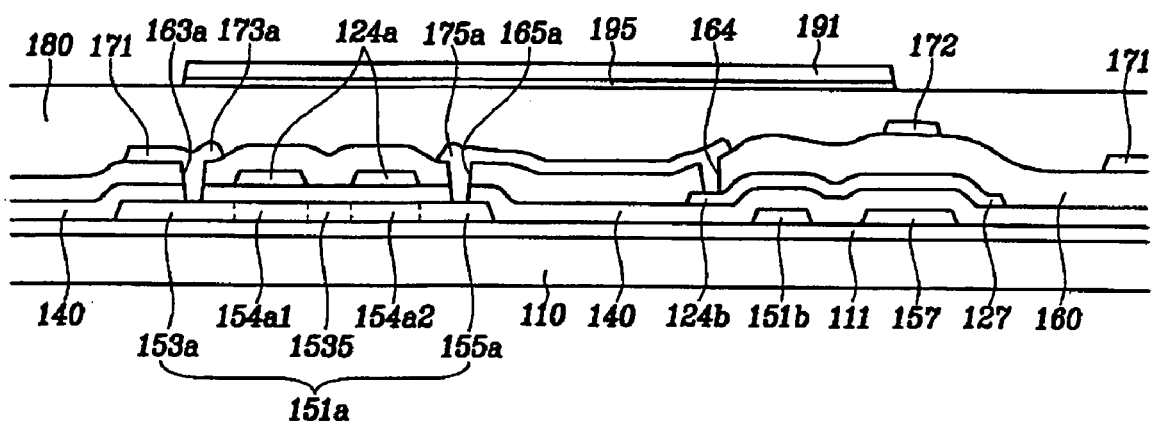
FIGS. 17A and 17B are sectional views of the OLED display shown in FIG. 16 taken along the lines XVIIA-XVIIA' and XVIIB-XVIIB', respectively.
Figure 17B:
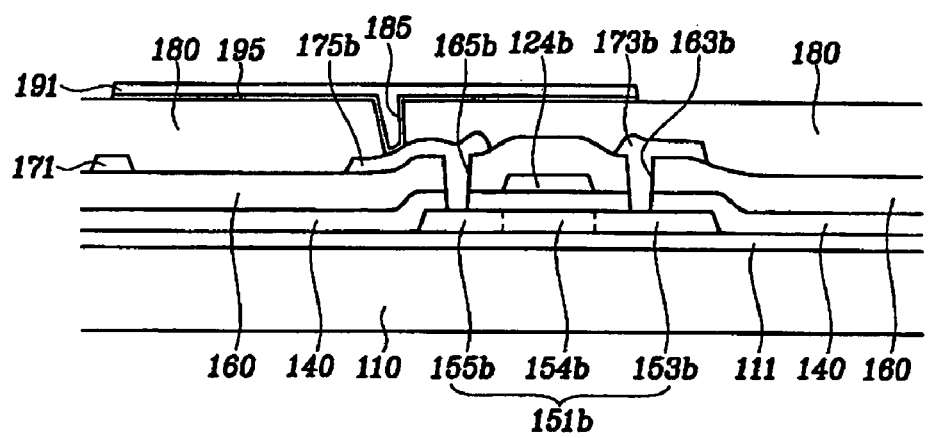

Referring to FIGS. 16-17B, a lower conductive layer 195 and an upper conductive layer 191 are sequentially deposited on the passivation layer 180 by sputtering or electron beam evaporation. The upper conductive layer 191 comprises, for example, a reflective metal such as Al, Ag, or Cr. The lower conductive layer 195 comprises, for example, ITO, IZO, or Mo, which has a thermal expansion coefficient ranging between that of the passivation layer 180 and that of a material of the upper conductive layer 191.

An additional conductive layer for auxiliary electrodes (not shown) may be deposited on the upper conductive layer 191 by sputtering or ion plating. The additional conductive layer may comprise ITO or IZO and may have a thickness of about 5 nm to about 500 nm.

The upper and the lower conductive layers (as well as the additional conductive layer) are patterned by lithography and etched to form a plurality of pixel electrodes 191, a plurality of connecting members, and a plurality of stress buffers 195. According to an embodiment of the present invention, the patterning of the upper and the lower conductive layers is performed under a single etch condition.

Heat treatment under a temperature of about 200° C. to about 300° C. for hardening the passivation layer 180 may be performed before a deposition of the lower conductive layer 195, or after the lower and the upper conductive layers 195, 191 are deposited. Although the hardening after the passivation layer 180 may expand the pixel electrodes 191 and the passivation layer 180 as well as the stress buffers 195, there is no exfoliation and no crack of the pixel electrodes 191 due to the stress caused by the difference in the thermal expansion rate since the stress buffers 195 have a thermal expansion coefficient between that of the passivation layer 180 and that of the pixel electrodes 191.

Figure 18:
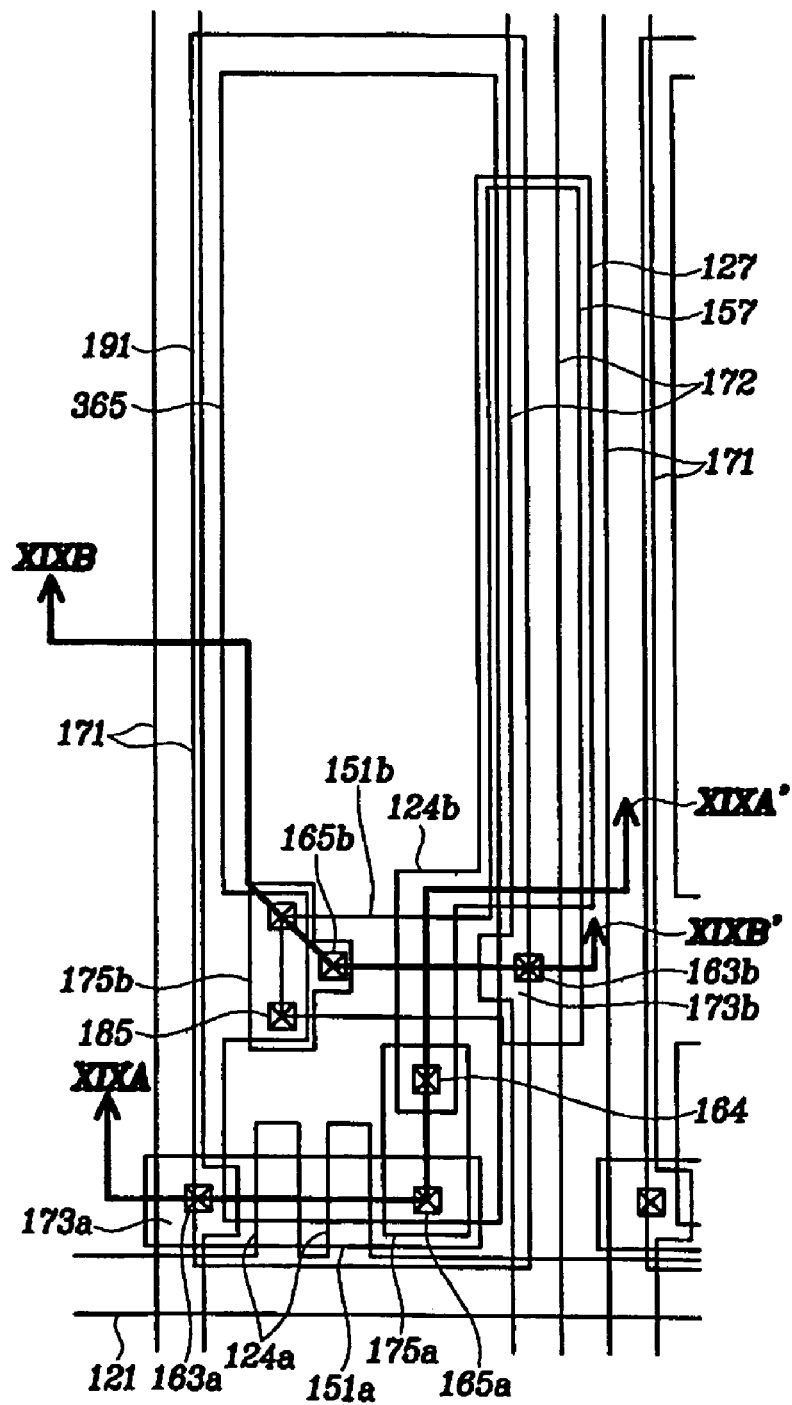
Figure 19A:
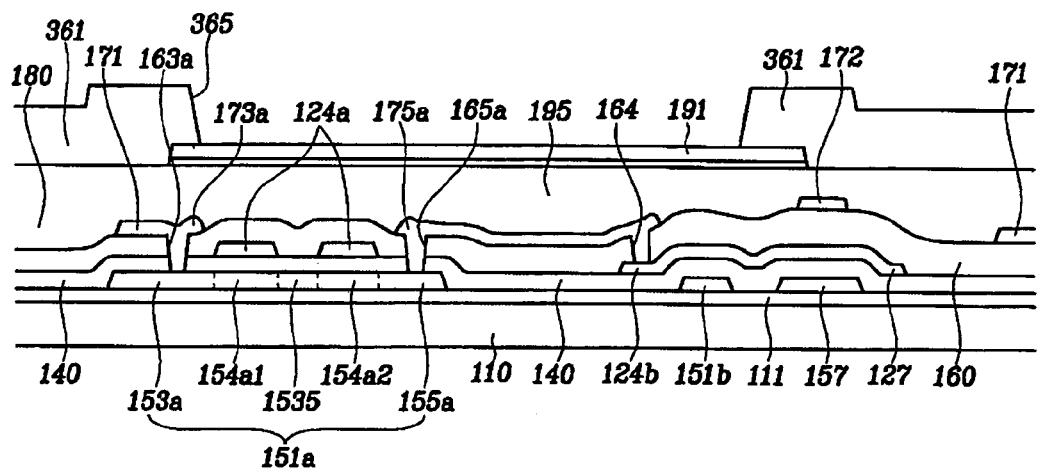
FIGS. 19A and 19B are sectional views of the OLED display shown in FIG. 18 taken along the lines XIXA-XIXA' and XIXB-XIXB'.
Figure 19B:
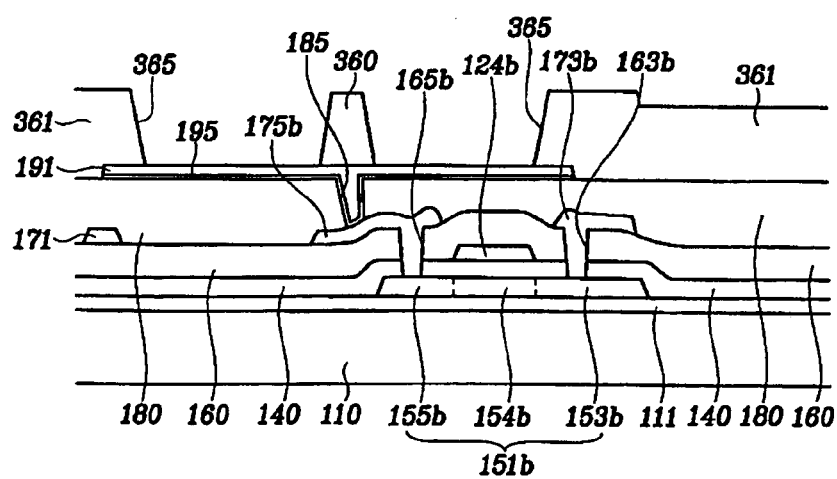

Referring to FIGS. 18-19B, an insulating layer is deposited and patterned to form a partition 361 having openings 365 on the pixel electrodes 191 and the passivation layer 180.

Referring to FIGS. 1-3, a plurality of organic light emitting members 370 preferably including multiple layers (not shown) are formed in the openings 365 on the pixel electrodes 191 by deposition or inkjet printing processes following a masking process. A common electrode 270 is formed on the light emitting members 370 and the partitions 361.

Experiments were performed for a Cr pixel electrode 191 and an organic passivation layer 180 comprising a material having a product name "PC455R1." A heat treatment process for hardening the passivation layer 180 was performed at a temperature of about 230° C. No crack and no exfoliation was observed for buffer members 195 comprising IZO having a thickness from about 90 nm to about 360 nm. There were very few observed cracks and exfoliation for buffer members 195 comprising Mo having a thickness from about 100 nm to about 350 nm. The thermal expansion coefficient of PC455R1 and Cr are $2.0\text{-}2.3 \times 10^6/°$ C. and $4.9 \times 10^6/°$ C., respectively, and the thermal expansion coefficient of Mo is $4.8 \times 10^6/°$ C.

An OLED display according to an embodiment of the present invention will be described in detail with reference to FIGS. 20-22.

Figure 20:
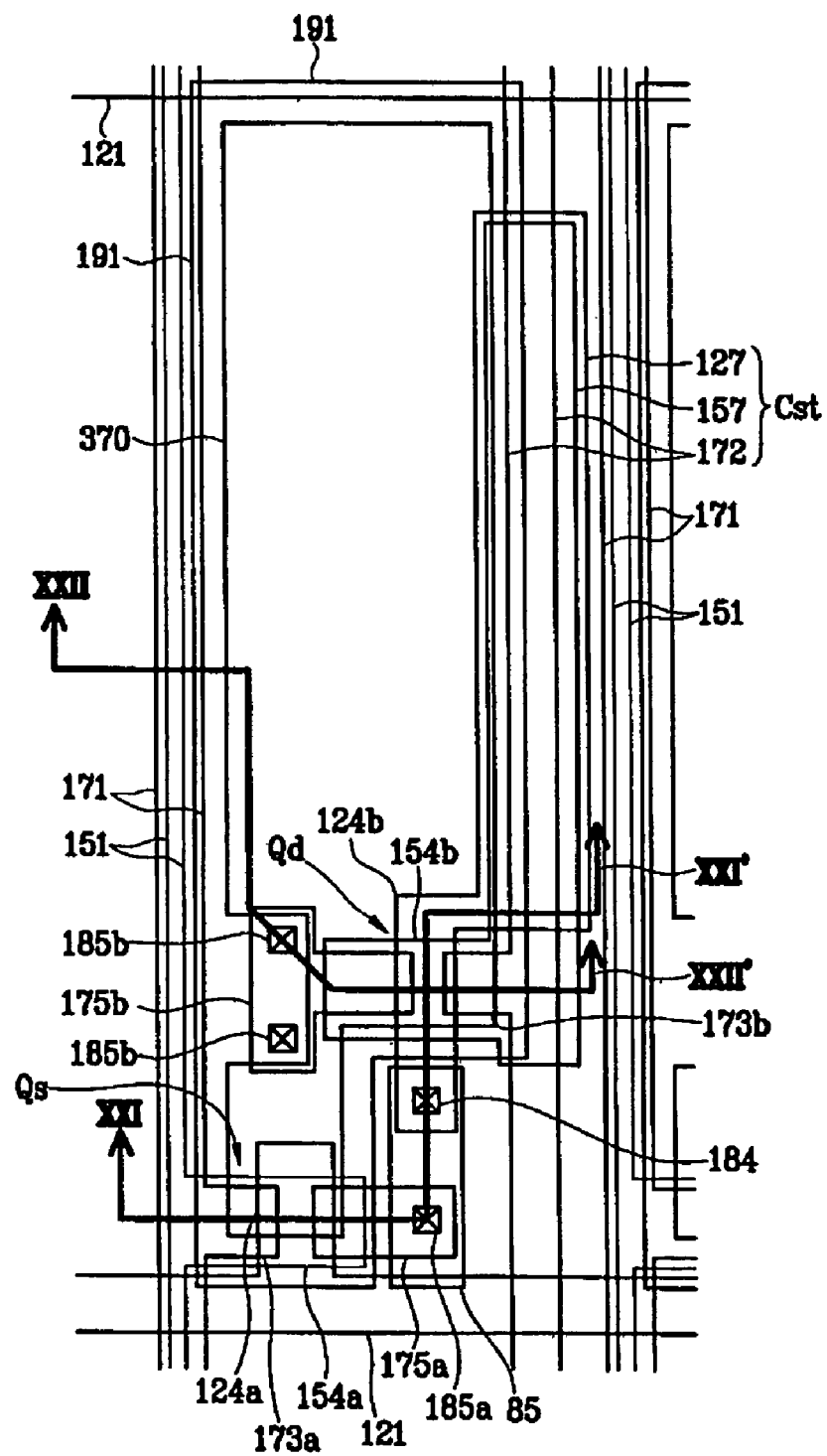
FIG. 20 is a layout view of an OLED display according to an embodiment of the present invention.

FIG. 20 is a layout view of an OLED display according to an embodiment of the present invention. FIGS. 21 and 22 are sectional views of the OLED display shown in FIG. 20 taken along the lines XXI-XXI' and XXII-XXII', respectively.

A plurality of gate conductors include a plurality of gate lines 121 including first control electrodes 124a and a plurality of second control electrodes 124b. The plurality of gate conductors are formed on an insulating substrate 110 such as transparent glass or plastic.

The gate lines 121 for transmitting gate signals extend substantially in a transverse direction. Each gate line 121 may further include an end portion having an area for contacting another layer or an external driving circuit. The first control electrodes 124a project from the gate line 121. The gate lines 121 may extend to be directly connected to a gate driving circuit (not shown) for generating the gate signals, which may be integrated on the substrate 110.

Each of the second control electrodes 124b is separated from the gate lines 121, and includes a storage electrode 127 extending upwardly.

The gate conductors 121 and 124b comprise, for example, an Al containing metal, an Ag containing metal, a Cu containing metal, a Mo containing metal, Cr, Ta, Ti, etc. The gate conductors 121 and 124b may have a multi-layered structure including two films having different physical characteristics. One of the two films may comprise a low resistivity metal including an Al containing metal, an Ag containing metal, and a Cu containing metal for reducing signal delay or voltage drop. The other film may comprise a material such as a Mo containing metal, Cr, Ta, or Ti, which has good physical, chemical, and electrical contact characteristics with other materials such as ITO or IZO. Examples of a combination are a lower Cr film and an upper Al (alloy) film or a lower Al (alloy) film and an upper Mo (alloy) film. Alternatively, the gate conductors 121 and 124b may comprise other various metals or conductors.

The lateral sides of the gate conductors 121 and 124b are inclined relative to a surface of the substrate 110, and the inclination angle thereof ranges from about 30° to about 80°.

A gate insulating layer 140 may comprise silicon nitride or silicon oxide, and is formed on the gate conductors 121 and 124b.

A plurality of semiconductor stripes and islands 151 and 154b comprising, for example, hydrogenated amorphous silicon (abbreviated to "a-Si") or polysilicon are formed on the gate insulating layer 140. Each semiconductor stripe 151 extends substantially in the longitudinal direction and includes a plurality of projections 154a branched out toward the first gate electrodes 124a. Each semiconductor island 154b intersects the second control electrodes 124b and includes an extension 157 overlapping a storage electrode 127.

A plurality of pairs of ohmic contact stripes and islands 161 and 165a and a plurality of pairs of ohmic contact islands 163b and 165b are formed on the semiconductor stripes and islands 151 and 154b, respectively. The ohmic contacts 161, 163b, 165a and 165b comprise, for example, silicide or n+ hydrogenated a-Si heavily doped with N type conductive impurity such as phosphorous. The ohmic contacts 161 and 165a are located in pairs on the semiconductor stripes 151, and the ohmic contacts 163b and 165b are located in pairs on the second semiconductor islands 154b.

A plurality of data conductors including a plurality of data lines 171, a plurality of driving voltage lines 172, and a plurality of first and second output electrodes 175a and 175b are formed on the ohmic contacts 161, 163b, 165b and 165b and the gate insulating layer 140.

The data lines 171 for transmitting data signals extend substantially in the longitudinal direction and intersect the gate lines 121. Each data line 171 includes a plurality of first input electrodes 173a extending toward the first control electrodes 124a. Each data line 171 may further include an end portion having an area for contacting another layer or an external driving circuit. The data lines 171 may extend to be directly connected to a data driving circuit (not shown) for generating data signals, which may be integrated on the substrate 110.

The driving voltage lines 172 for transmitting driving voltages extend substantially in the longitudinal direction and intersect the gate lines 121. Each driving voltage line 172 includes a plurality of second input electrodes 173b extending toward the second control electrodes 124b. The driving voltage lines 172 overlap the storage electrodes 127. The driving voltage lines 172 and the storage electrodes 127 may be connected to each other.

The first and the second output electrodes 175a and 175b are separated from each other. The first and the second output electrodes 175a and 175b are separated from the data lines 171 and the driving voltage lines 172. Each pair of the first input electrodes 173a and the first output electrodes 175a are disposed opposite each other with respect to a first control electrode 124a. Each pair of the second input electrodes 173b and the second output electrodes 175b are disposed opposite each other with respect to a second control electrode 124b.

The data conductors 171, 172, 175a and 175b comprise, for example, a refractory metal including Mo, Cr, Ti, Ta or alloys thereof. The data conductors 171, 172, 175a and 175b may have a multi-layered structure including a refractory metal film and a low resistivity film. Examples of the multi-layered structure are a double-layered structure including a lower Cr film and an upper Al (alloy) film, or a double-layered structure of a lower Mo (alloy) film and an upper Al (alloy) film. Alternatively, the data conductors 171, 172, 175a and 175b may have a triple-layered structure of a lower Mo (alloy) film, an intermediate Al (alloy) film, and an upper Mo (alloy) film.

Like the gate conductors 121 and 124b, the data conductors 171, 172, 175a and 175b have inclined edge profiles, and the inclination angles thereof range from about 30° to about 80°.

The ohmic contacts 161, 163b, 165b and 165b are interposed between the underlying semiconductor stripes and islands 151 and 154b and the overlying data conductors 171, 172, 175a and 175b, thereby reducing the contact resistance therebetween. The semiconductor stripes and island 151 and 154b include a plurality of exposed portions, which are not covered with the data conductors 171, 172, 175a and 175b, such as portions disposed between the input electrodes 173a and 173b and the output electrodes 175a and 175b.

A passivation layer 180 is formed on the data conductors 171, 172, 175a and 175b and the exposed portions of the semiconductor stripes and islands 151 and 154b. The passivation layer 180 may comprise an organic insulator or a low dielectric insulator. The low dielectric insulator and the organic insulator may comprise a dielectric constant less than about 4.0, and includes a-Si:C:O and a-Si:O:F formed by plasma enhanced chemical vapor deposition (PECVD). The organic insulator for the passivation layer 180 may have photosensitivity. The passivation 180 may have a flat surface. The passivation layer 180 may include a lower film of an inorganic insulator and an upper film of an organic insulator for having good insulating characteristics of the organic insulator while preventing the exposed portions of the semiconductor stripes and islands 151 and 154b from being damaged by the organic insulator.

The passivation layer 180 has a plurality of contact holes 182, 185a and 185b exposing the end portions of the data lines 171, the first output electrodes 175a, and the second output electrodes 175b, respectively. The passivation layer 180 and the gate insulating layer 140 have a plurality of contact holes 181 and 184 exposing the end portions of the gate lines 121 and the second control electrodes 124b, respectively.

A plurality of stress buffers 195 and 196 are formed on the passivation layer 180 and a plurality of pixel electrodes 191 and a plurality of connecting members 85 are formed on the stress buffers 195 and 196, respectively.

The pixel electrodes 191 and the connecting members 85 may comprise, for example, a reflective conductor such as Cr, Al, Ag, or alloys thereof. The stress buffers 195 and 196 may comprise, for example, a material having a thermal expansion coefficient ranging from that of the passivation layer 180 to that of the pixel electrodes 191, which includes ITO, IZO or Mo containing metal.

The pixel electrodes 191 and the stress buffers 195 thereunder are connected to the second output electrodes 175b through the contact holes 185b. The connecting members 85 and the stress buffers 196 thereunder are connected to the second control electrodes 124b and the first output electrodes 175a through the contact holes 184 and 185b.

A partition 361 having a plurality of openings 365, a plurality of light emitting members 370, and a common electrode 270 are formed on the pixel electrodes 191 and the passivation layer 180 like the OLED display shown in FIGS. 1-3.

The semiconductor stripes and islands 151 and 154b, if it is made of polysilicon, include intrinsic regions (not shown) disposed under the gate electrodes 124a and 124b and extrinsic regions (not shown) disposed opposite each other with respect to the intrinsic regions. The extrinsic regions are electrically connected to the input electrodes 173a and 173b and the output electrodes 175a and 175b, and the ohmic contacts 161, 163b, 165a and 165b may be omitted.

A method of manufacturing the OLED display shown in FIGS. 20-22 according to an embodiment of the present invention is described with reference to FIGS. 23-34B as well as FIGS. 20-22.

Figure 21:
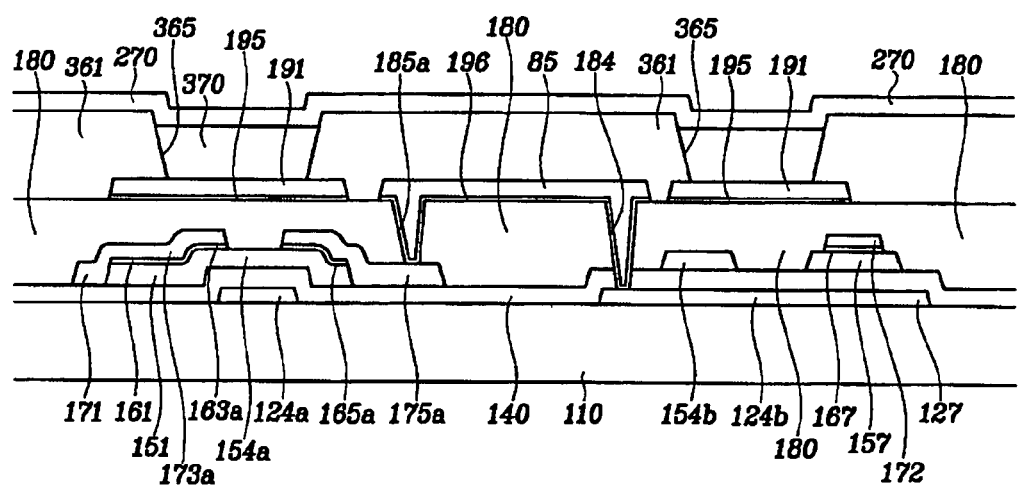
FIGS. 21 and 22 are sectional views of the OLED display shown in FIG. 20 taken along the lines XXI-XXI' and XXII-XXII', respectively.
Figure 22:
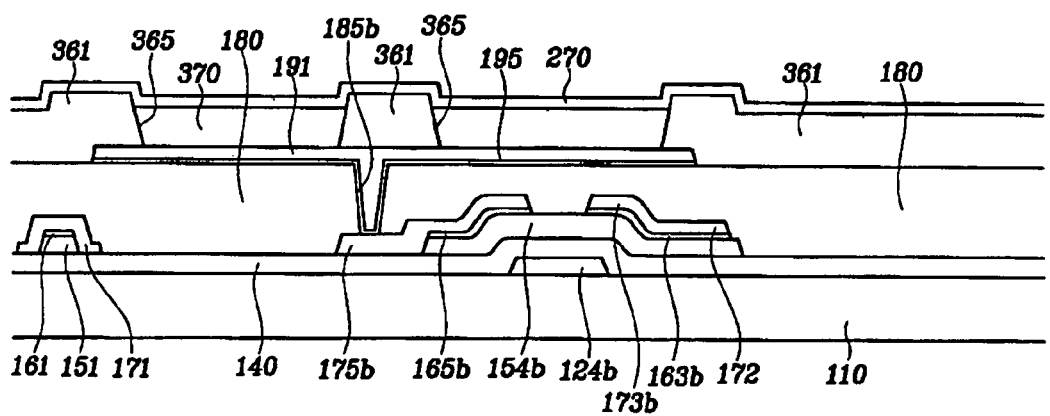

FIGS. 23, 25, 27, 29, 31 and 33 are layout views of intermediate steps of manufacturing an OLED display shown in FIGS. 20-22 according to an embodiment of the present invention. FIGS. 24A and 24B are sectional views of the OLED display shown in FIG. 23 taken along the lines XXIVA-XXIVA' and XXIVB-XXIVB', respectively. FIGS. 26A and 26B are sectional views of the OLED display shown in FIG. 25 taken along the lines XXVIA-XXVIA' and XXVIB-XXVIB', respectively. FIGS. 28A and 28B are sectional views of the OLED display shown in FIG. 27 taken along the lines XXVIIIA-XXVIIIA' and XXVIIIB-XXVIIIB', respectively. FIGS. 30A and 30B are sectional views of the OLED display shown in FIG. 29 taken along the lines XXXA-XXXA' and XXXB-XXXB', respectively. FIGS. 32A and 32B are sectional views of the OLED display shown in FIG. 31 taken along the lines XXXIIA-XXXIIA' and XXXIIB-XXXIIB', respectively. FIGS. 34A and 34B are sectional views of the OLED display shown in FIG. 33 taken along the lines XXXIVA-XXXIVA' and XXXIVB-XXXIVB', respectively.

Figure 23:
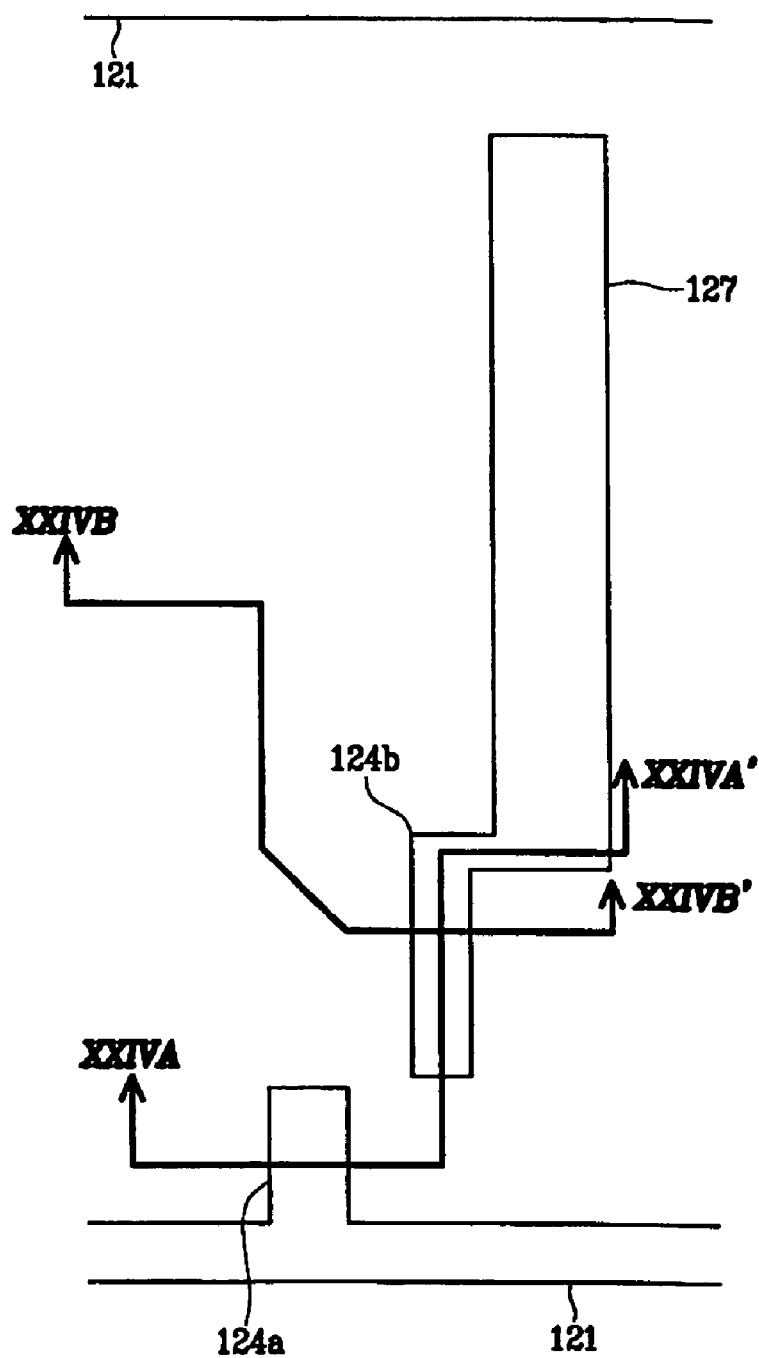
FIGS. 23, 25, 27, 29, 31 and 33 are layout views of intermediate steps of manufacturing an OLED display shown in FIGS. 20-22 according to an embodiment of the present invention.
Figure 24A:
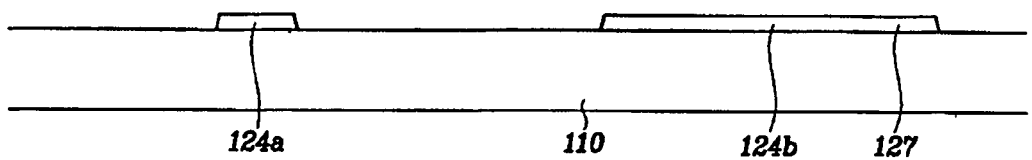
FIGS. 24A and 24B are sectional views of the OLED display shown in FIG. 23 taken along the lines XXIVA-XXIVA' and XXIVB-XXIVB', respectively.
Figure 24B:
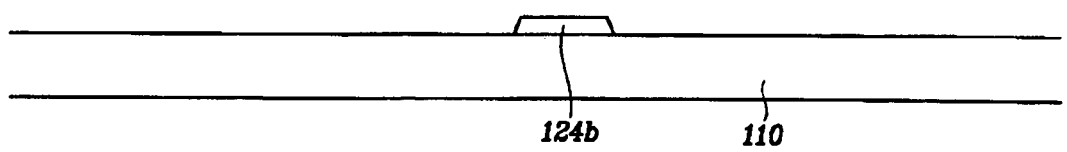

Referring to FIGS. 23-24B, a plurality of gate conductors include a plurality of gate lines 121 including first control electrodes 124a and a plurality of second control electrodes 124b including storage electrodes 127. The plurality of gate conductors are formed on an insulating substrate 110 such as transparent glass or plastic.

Figure 25:
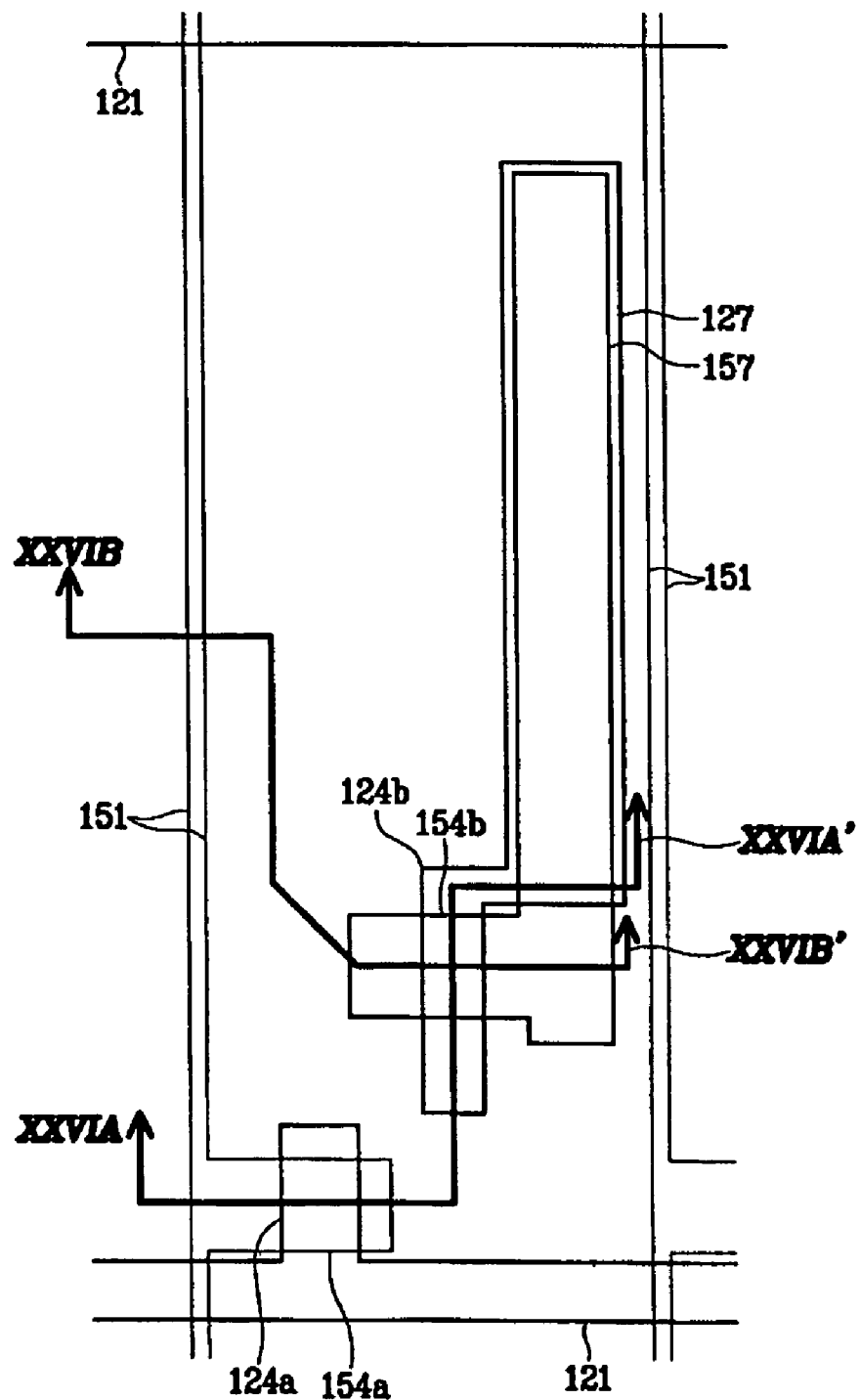
Figure 26A:
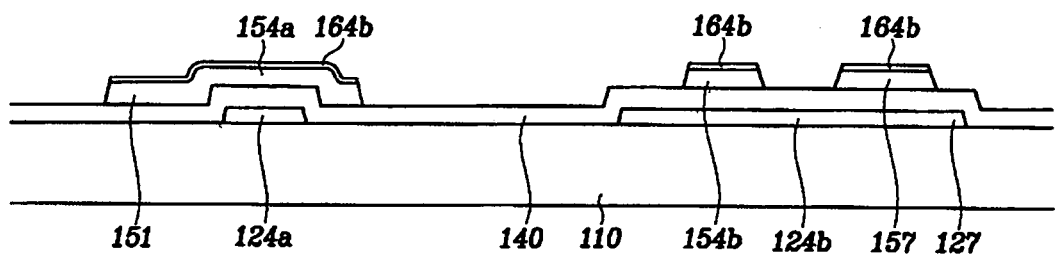
FIGS. 26A and 26B are sectional views of the OLED display shown in FIG. 25 taken along the lines XXVIA-XXVIA' and XXVIB-XXVIB', respectively.
Figure 26B:
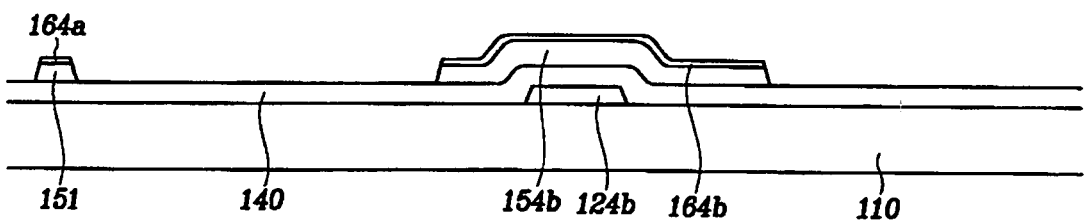

Referring to FIGS. 25-26B, after sequential deposition of a gate insulating layer 140, an intrinsic a-Si layer, and an extrinsic a-Si layer on the gate insulating layer 140, the extrinsic a-Si layer and the intrinsic a-Si layer are patterned by lithography and are etched to form a plurality of extrinsic semiconductor stripes and islands 164a and 164b and a plurality of intrinsic semiconductor stripes and islands 151 and 154b. Each of the semiconductor stripes 151 includes a plurality of projections 154a.

Figure 27:
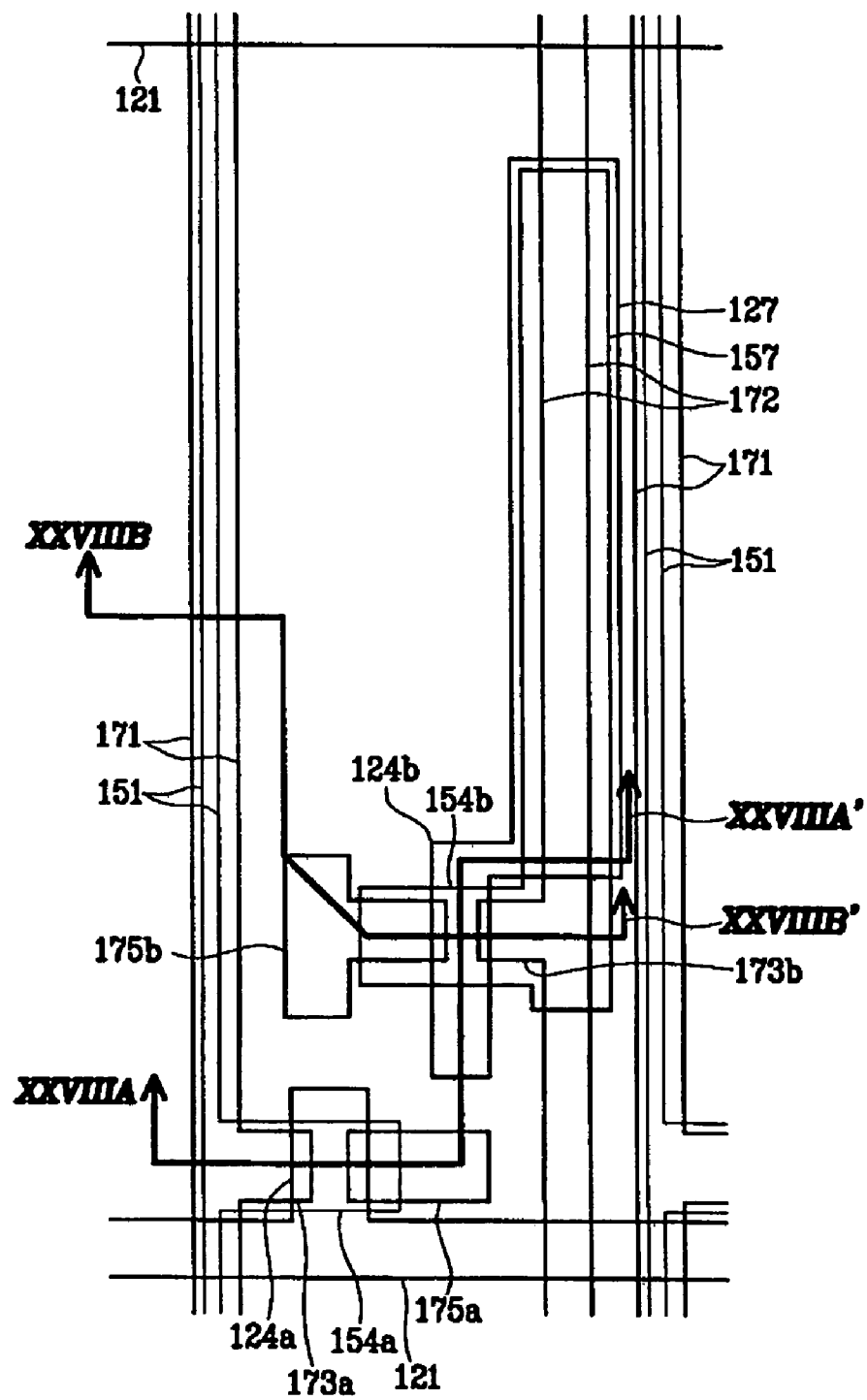
Figure 28A:
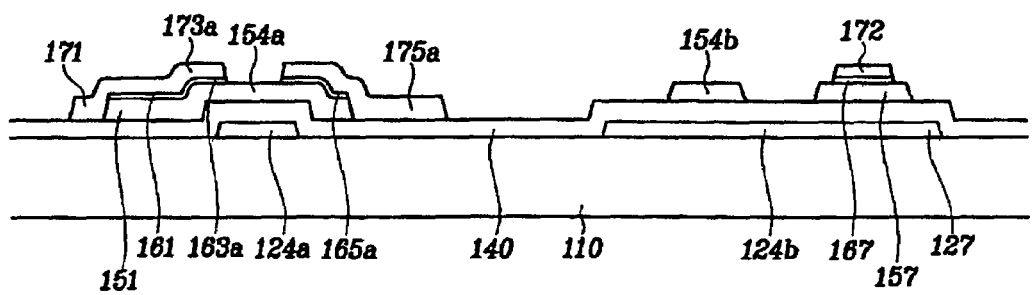
FIGS. 28A and 28B are sectional views of the OLED display shown in FIG. 27 taken along the lines XXVIIIA-XXVIIIA' and XXVIIIB-XXVIIIB', respectively.
Figure 28B:
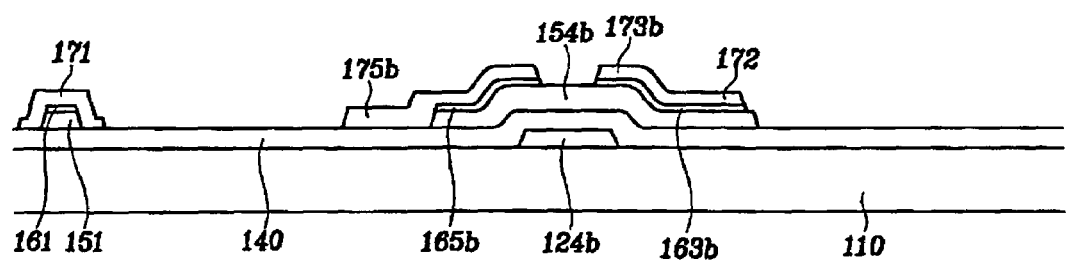

Referring to FIGS. 27-28B, a plurality of data conductors are formed on the gate insulating layer 140 and the extrinsic semiconductor stripes and islands 164a and 164b. The data conductors include a plurality of data lines 171 including first input (e.g., source) electrodes 173a, a plurality of driving voltage lines 172 including second input (e.g., source) electrodes 173b, and a plurality of first and second output (e.g., drain) electrodes 175a and 175b.

Thereafter, portions of the extrinsic semiconductor stripes 164a and 164b, which are not covered with the data conductors 171, 172, 175a and 175b, are removed by an etch process. The etch process forms a plurality of ohmic contact stripes 161 including projections 163a and a plurality of ohmic contact islands 163b, 165a and 165b and exposes portions of the intrinsic semiconductor stripes and islands 151 and 154b. Oxygen plasma treatment may be performed to stabilize the exposed surfaces of the semiconductor stripes and islands 151 and 154b.

Figure 29:
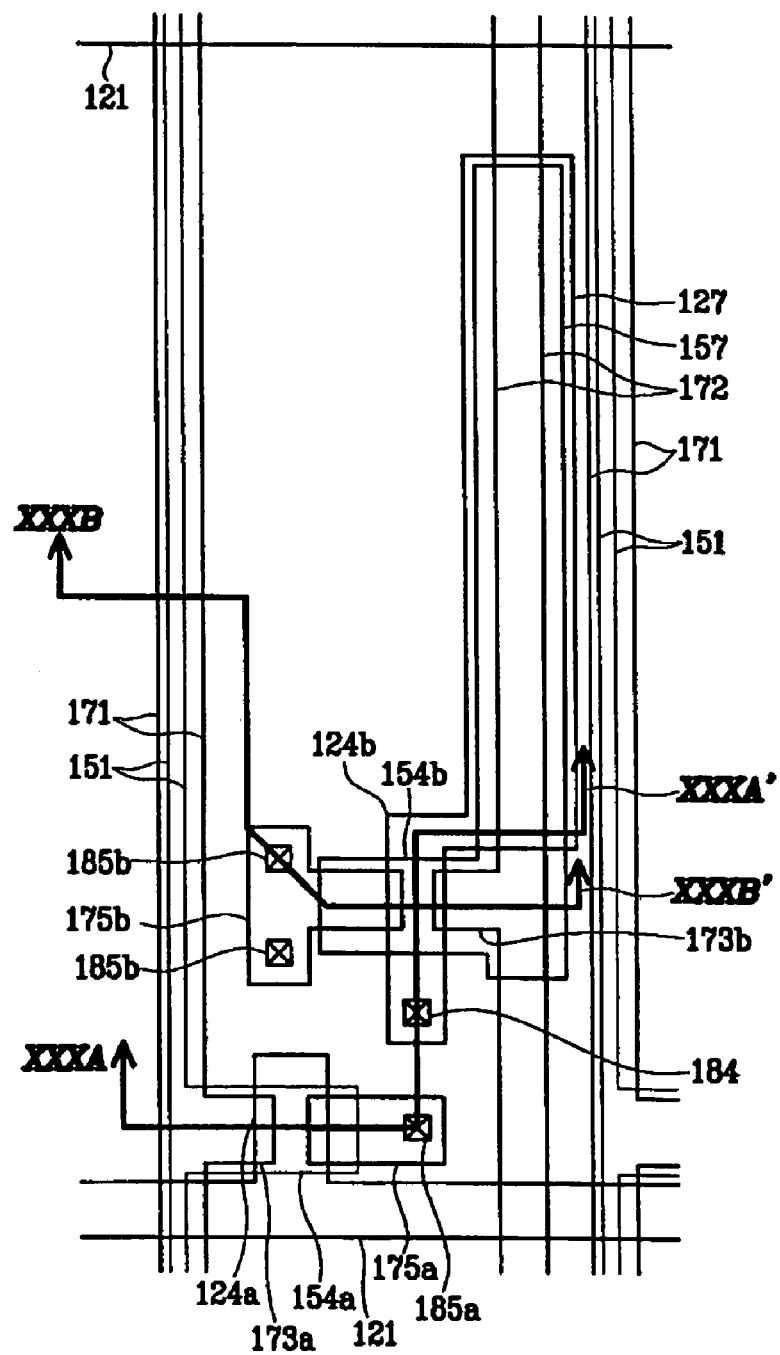
Figure 30A:
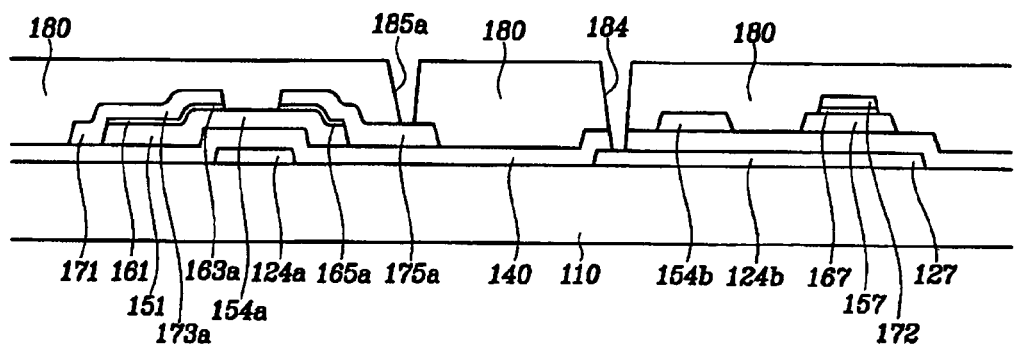
FIGS. 30A and 30B are sectional views of the OLED display shown in FIG. 29 taken along the lines XXXA-XXXA' and XXXB-XXXB', respectively.
Figure 30B:
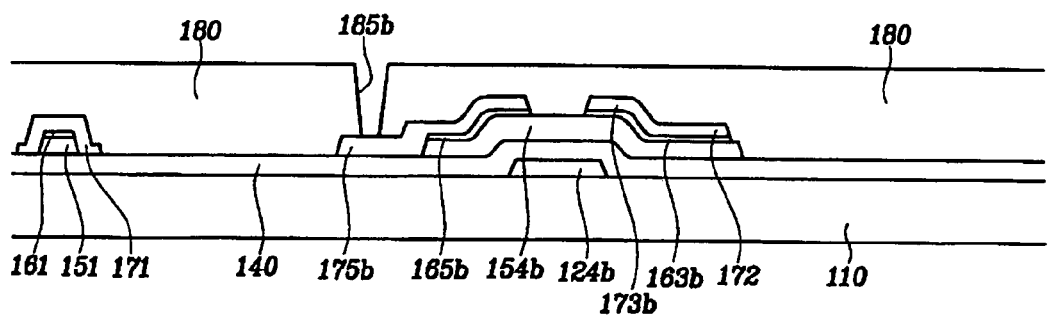

Referring to FIGS. 29-30B, a passivation layer 180 comprising, for example, an organic material is deposited and patterned by lithography and etched to form a plurality of contact holes 184, 185a and 185b. The plurality of contact holes 184, 185a and 185b expose the second gate electrodes 121b, the first drain electrodes 175a, and the second drain electrodes 175b, respectively.

Figure 31:
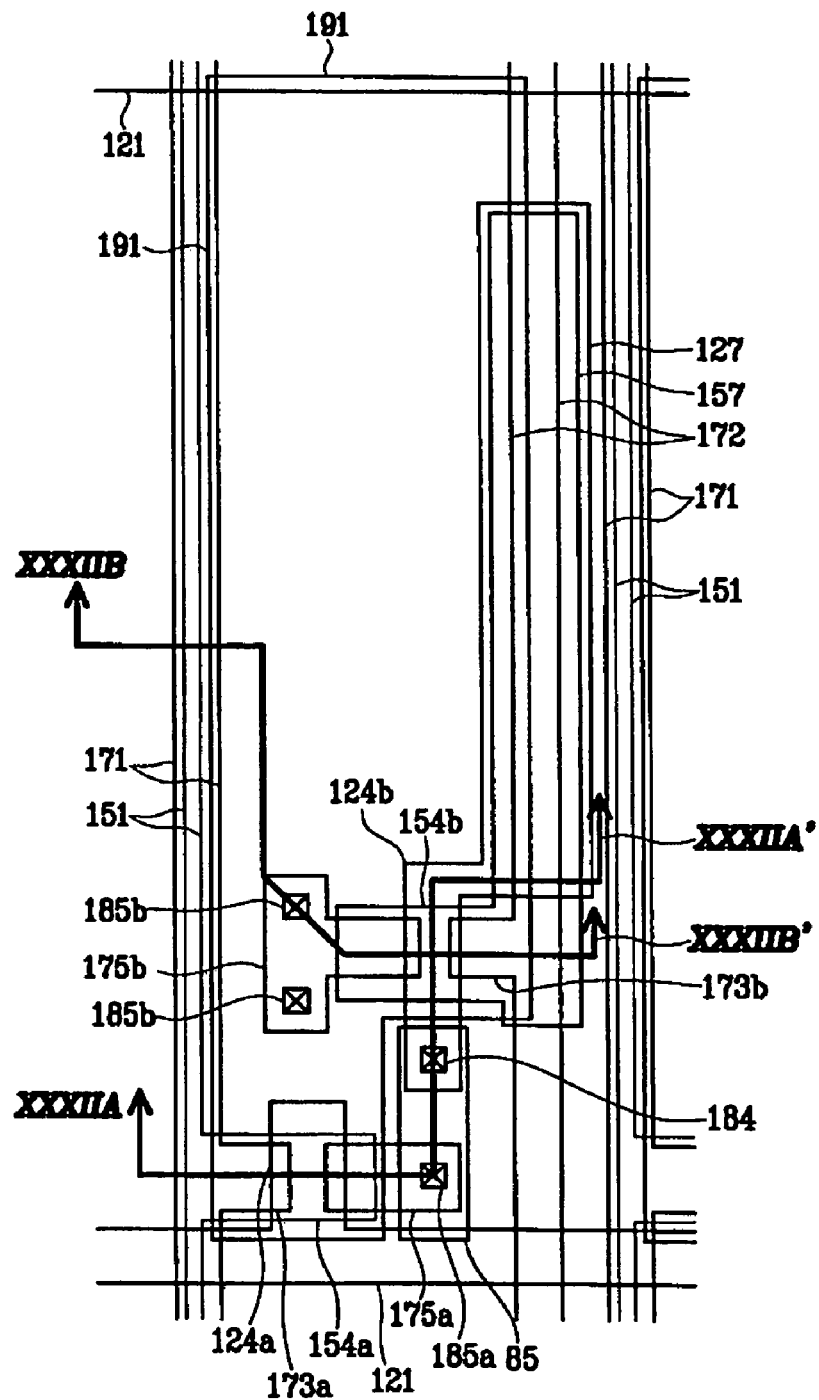
Figure 32A:
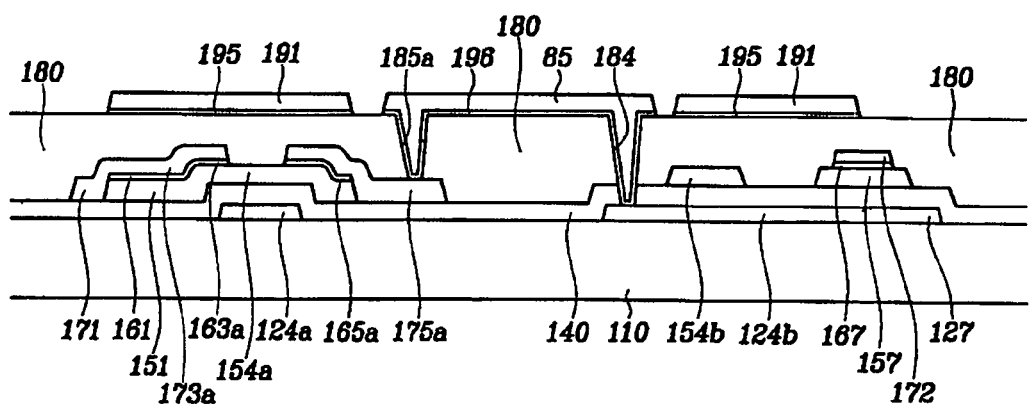
FIGS. 32A and 32B are sectional views of the OLED display shown in FIG. 31 taken along the lines XXXIIA-XXXIIA' and XXXIIB-XXXIIB', respectively.
Figure 32B:
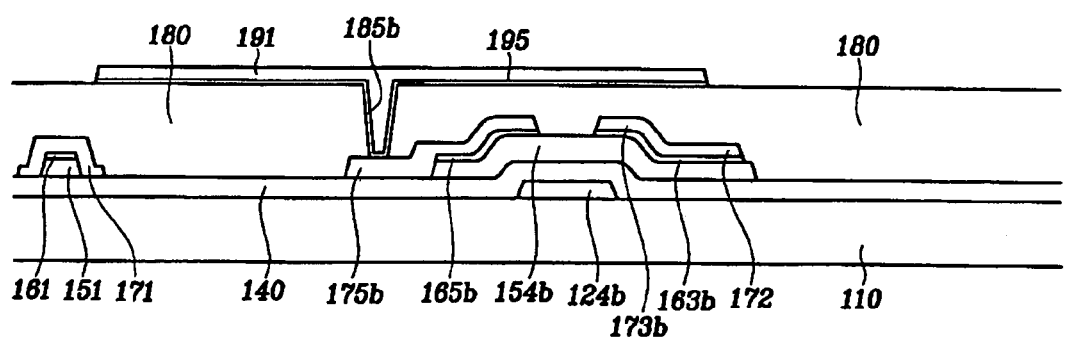

Referring to FIGS. 31-32B, a lower conductive layer comprising, for example, a reflective metal such as Al, Ag, or Cr and an upper conductive layer comprising, for example, ITO, IZO, or Mo are sequentially deposited on the passivation layer 180. The lower conductive layer and the upper conductive layer are patterned by lithography and etched to form a plurality of stress buffers 195 and 196, a plurality of pixel electrodes 191, and a plurality of connecting members 85.

Figure 33:
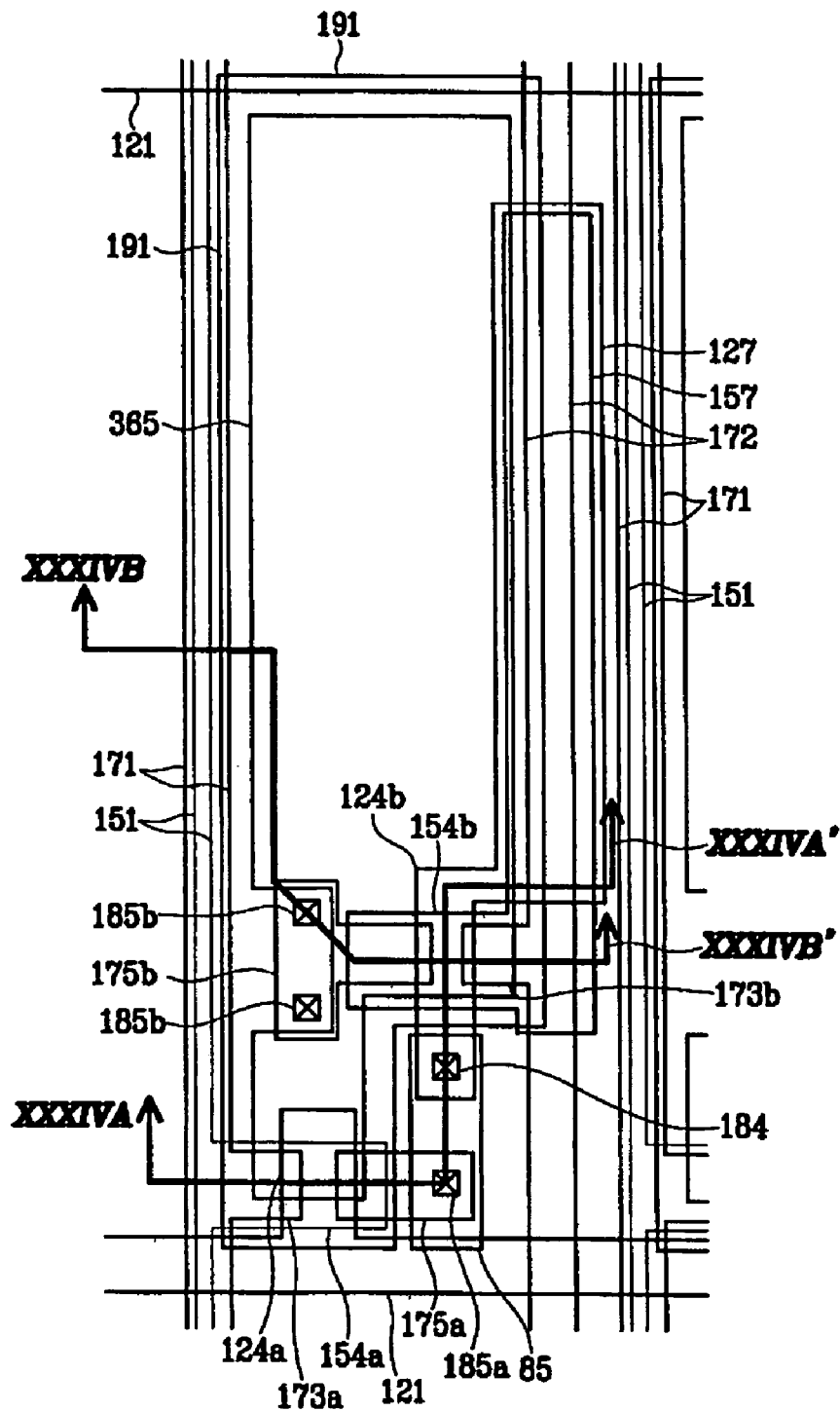
Figure 34A:
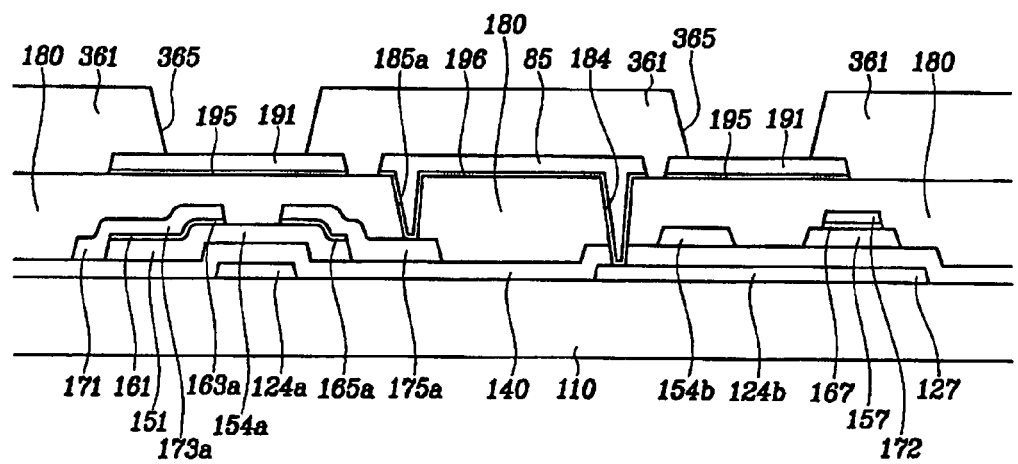
FIGS. 34A and 34B are sectional views of the OLED display shown in FIG. 33 taken along the lines XXXIVA-XXXIVA' and XXXIVB-XXXIVB', respectively.
Figure 34B:
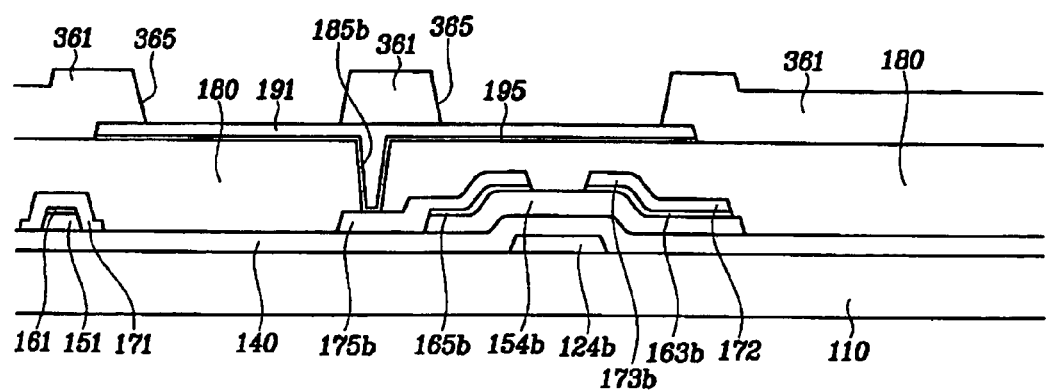

Referring to FIGS. 33-34B, a partition 361 having openings 365 is formed on the pixel electrodes 191, the connecting members 85, and the passivation layer 180.

A plurality of organic light emitting members 370 and a common electrode 270 are sequentially formed on the pixel electrodes 191 as shown in FIGS. 20-22. The stress buffers 195 and 196 can be employed to a simple matrix OLED display.

Although preferred embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention.

What is claimed is:

1. An organic light emitting diode display comprising:
an insulating layer;
a stress buffer disposed on the insulating layer;
a first electrode disposed on the stress buffer;
an organic light emitting member disposed on the first electrode; and
a second electrode disposed on the organic light emitting member,
wherein the stress buffer has a thermal expansion coefficient between a thermal expansion coefficient of the insulating layer and a thermal expansion coefficient of the first electrode.

2. The organic light emitting diode display of claim 1, wherein the insulating layer comprises an organic material.

3. The organic light emitting diode display of claim 2, wherein the insulating layer is hardened by heat.

4. The organic light emitting diode display of claim 1, wherein, the stress buffer comprises at least one of ITO, IZO, or Mo.

5. The organic light emitting diode display of claim 1, wherein the first electrode comprises at least one of Cr, Al, or Ag.

6. The organic light emitting diode display of claim 1, wherein the first electrode comprises Cr and the stress buffer comprises at least one of Si, W, or Mo.

7. The organic light emitting diode display of claim 1, wherein the first electrode comprises Ag and the stress buffer comprises at least one of Si, W, Mo, Cr, Ge, Nb, Ti, Pt, Ni, Au, or Cu.

8. The organic light emitting diode display of claim 1, wherein the first electrode comprises Al and the stress buffer comprises at least one of Si, W, Mo, Cr, Ge, Nb, Ti, Pt, Ni, Au, Cu, or Mn.

9. The organic light emitting diode display of claim 1, wherein the first electrode comprises a reflective material and the second electrode comprises a transparent material.

10. The organic light emitting diode display of claim 9, further comprising a third electrode disposed between the first electrode and the organic light emitting member.

11. The organic light emitting diode display of claim 10, wherein the third electrode has a higher work function than the first electrode.

12. The organic light emitting diode display of claim 10, wherein the third electrode comprises ITO or IZO.

13. The organic light emitting diode display of claim 1, wherein the stress buffer has substantially the same planar shape as the first electrode.

14. The organic light emitting diode display of claim 1, further comprising:
a gate line transmitting a gate signal;
a data line transmitting a data signal;
a driving voltage line transmitting a driving voltage;
a switching transistor coupled to the gate line and the data line; and
a driving transistor coupled to the switching transistor, the driving voltage line, and the first electrode.

15. The organic light emitting diode display of claim 14, further comprising a connecting member disposed on the insulating layer and connecting the switching transistor and the driving transistor.

16. A method of manufacturing an organic light emitting diode display, the method comprising:
forming an insulating layer;
forming a stress buffer on the insulating layer;
forming a first electrode on the stress buffer;
forming an organic light emitting member on the first electrode; and
forming a second electrode on the organic light emitting member,
wherein the stress buffer has a thermal expansion coefficient between a thermal expansion coefficient of the insulating layer and a thermal expansion coefficient of the first electrode.

17. The method of claim 16, further comprising:
hardening the insulating layer at a temperature of about 200° C. to about 300° C.

* * * * *